United States Patent
Akiyama et al.

(10) Patent No.: US 8,646,180 B2
(45) Date of Patent: Feb. 11, 2014

(54) METHOD FOR PRODUCING ELECTROMECHANICAL TRANSDUCER, ELECTROMECHANICAL TRANSDUCER PRODUCED BY THE METHOD, LIQUID-DROPLET JETTING HEAD, AND LIQUID-DROPLET JETTING APPARATUS

(75) Inventors: Yoshikazu Akiyama, Kanagawa (JP); Takakazu Kihira, Kanagawa (JP); Keiji Ueda, Kanagawa (JP); Akira Shimofuku, Kanagawa (JP); Osamu Machida, Kanagawa (JP)

(73) Assignee: Ricoh Company, Ltd., Tokyo (JP)

( * ) Notice: Subject to any disclaimer, the term of this patent is extended or adjusted under 35 U.S.C. 154(b) by 27 days.

(21) Appl. No.: 13/265,192

(22) PCT Filed: May 27, 2010

(86) PCT No.: PCT/JP2010/059404
§ 371 (c)(1),
(2), (4) Date: Oct. 19, 2011

(87) PCT Pub. No.: WO2010/137737
PCT Pub. Date: Dec. 2, 2010

(65) Prior Publication Data
US 2012/0038712 A1      Feb. 16, 2012

(30) Foreign Application Priority Data

May 28, 2009   (JP) .................... 2009-128383
May 25, 2010   (JP) .................... 2010-119873

(51) Int. Cl.
*B21D 53/76*   (2006.01)
*B23P 17/00*   (2006.01)
*B41J 2/015*   (2006.01)

(52) U.S. Cl.
USPC ........................................ 29/890.1; 347/20

(58) Field of Classification Search
USPC ............ 29/890.1, 25.35; 347/20, 40; 310/311, 310/316.01, 317
See application file for complete search history.

(56) References Cited

U.S. PATENT DOCUMENTS 5,719,417 A * 2/1998 Roeder et al. ............... 257/295
5,729,262 A * 3/1998 Akiyama et al. ............. 347/70
(Continued)

FOREIGN PATENT DOCUMENTS

JP    3019845    3/2000
JP    3307400    7/2002
(Continued)

OTHER PUBLICATIONS

Budd, K. D., et al., "Sol-Gel Processing of PbTiO3, PbZrO3, PZT, and PLZT Thin Films," Proc. Brit. Ceram. Soc., vol. 36, pp. 107-121, (1985).

(Continued)

*Primary Examiner* — David Angwin
(74) *Attorney, Agent, or Firm* — Oblon, Spivak, McClelland, Maier & Neustadt, L.L.P.

(57) ABSTRACT

A method of producing an electromechanical transducer includes a first step of partially modifying a surface of a first electrode; a second step of applying a sol-gel liquid including a metal composite oxide to a predetermined area of the partially-modified surface of the first electrode; a third step of performing drying, thermal decomposition, and crystallization on the applied sol-gel liquid to form an electromechanical transduction film, wherein the drying includes a heat-treatment at 120° C., the decomposition includes thermal decomposition performed at 500° C., and the crystallization includes heat treatment for crystallization at 700° C.; a fourth step of repeating the first, second, and third steps to obtain the electromechanical transduction film with a desired thickness; and a fifth step of forming a second electrode on the electromechanical transduction film.

10 Claims, 25 Drawing Sheets

(56) References Cited

U.S. PATENT DOCUMENTS

| | | | |
|---|---|---|---|
| 5,814,923 A * | 9/1998 | Shimada | 310/311 |
| 6,247,799 B1 * | 6/2001 | Sakamaki et al. | 347/68 |
| 6,284,434 B1 * | 9/2001 | Kamei et al. | 430/319 |
| 6,469,421 B1 * | 10/2002 | Wakabayashi et al. | 310/328 |
| 6,605,849 B1 * | 8/2003 | Lutwak et al. | 257/415 |
| 7,731,933 B2 * | 6/2010 | Kijima et al. | 423/594.12 |
| 7,772,748 B2 * | 8/2010 | Sumi | 310/358 |
| 7,807,216 B2 * | 10/2010 | Zhu et al. | 427/100 |
| 7,878,631 B2 * | 2/2011 | Kuriki et al. | 347/68 |
| 7,896,479 B2 * | 3/2011 | Kazama et al. | 347/68 |
| 7,896,480 B2 * | 3/2011 | Kazama et al. | 347/68 |
| 7,918,543 B2 * | 4/2011 | Kazama et al. | 347/68 |
| 8,093,786 B2 * | 1/2012 | Shi et al. | 310/367 |
| 2002/0080213 A1 * | 6/2002 | Shimada et al. | 347/68 |
| 2004/0010980 A1 * | 1/2004 | Cornwall | 52/1 |
| 2004/0013794 A1 * | 1/2004 | Hashimoto et al. | 427/100 |
| 2004/0101980 A1 | 5/2004 | Kurokawa et al. | |

FOREIGN PATENT DOCUMENTS

| | | |
|---|---|---|
| JP | 2002 543429 | 12/2002 |
| JP | 3400218 | 4/2003 |
| JP | 2003 297825 | 10/2003 |
| JP | 2004 6645 | 1/2004 |
| JP | 3682684 | 8/2005 |
| JP | 2005 327920 | 11/2005 |
| JP | 2005327920 | * 11/2005 |
| JP | 2007-276158 | 10/2007 |
| JP | 2008-87469 | 4/2008 |
| JP | 2009 031023 | 2/2009 |
| WO | 03 098714 | 11/2003 |

OTHER PUBLICATIONS

Kumar, A., et al., "Features of gold having micrometer to centimeter dimensions can be formed through a combination of stamping with an elastomeric stamp and an alkanethiol "ink" followed by chemical etching," Appl. Phys. Lett., vol. 63, pp. 2002-2004, (Oct. 4, 1993).
International Search Report Issued Jun. 29, 2010 in PCT/JP10/059404 Filed May 27, 2010.
Japanese Office Action (2010-119873) dated Sep. 9, 2013.

* cited by examiner

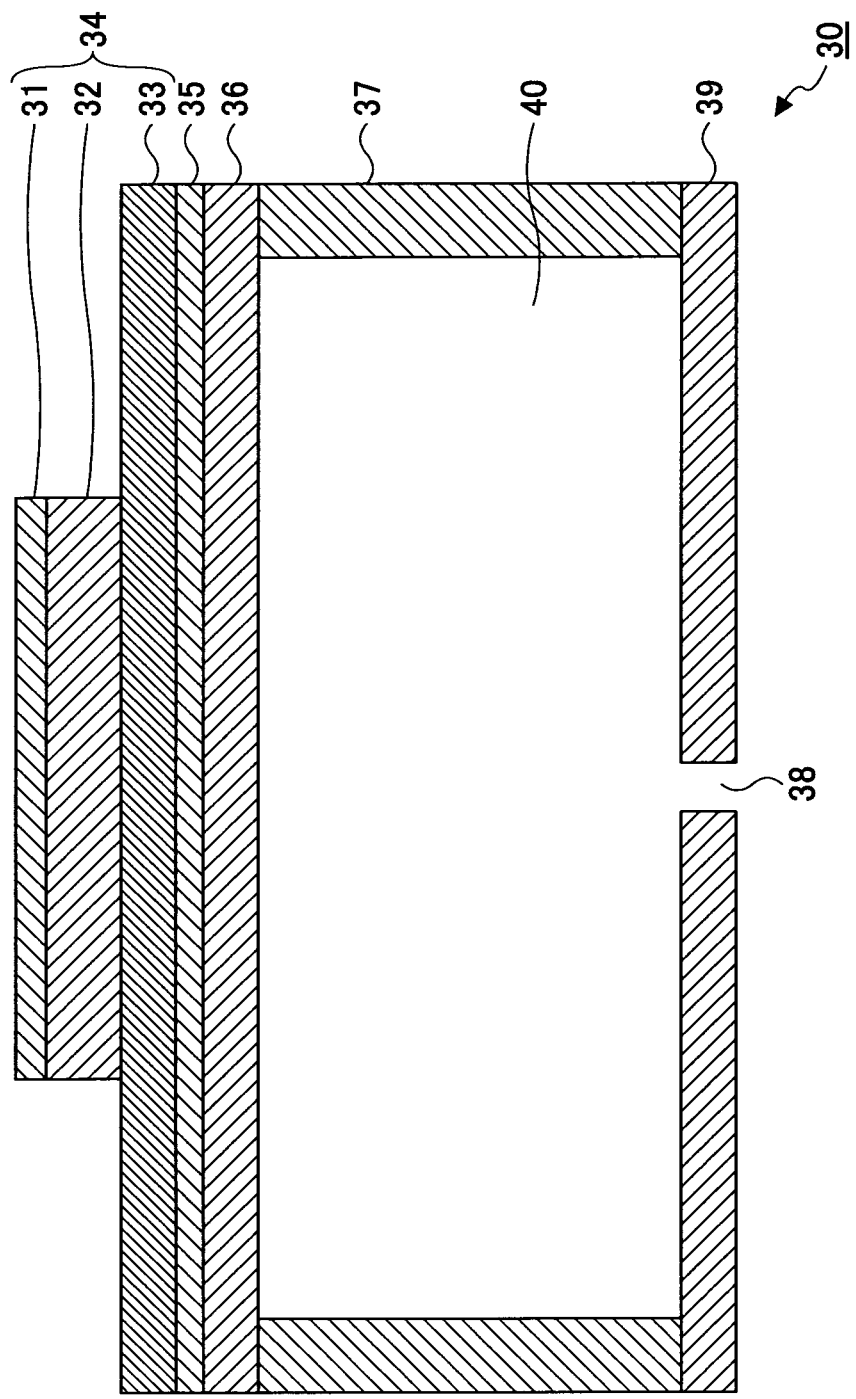

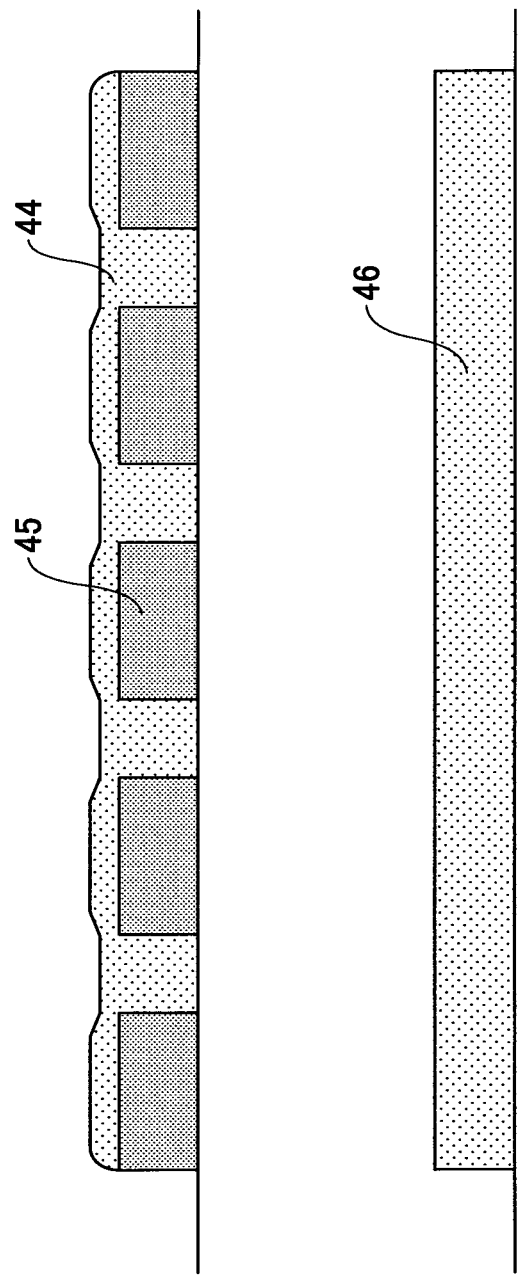

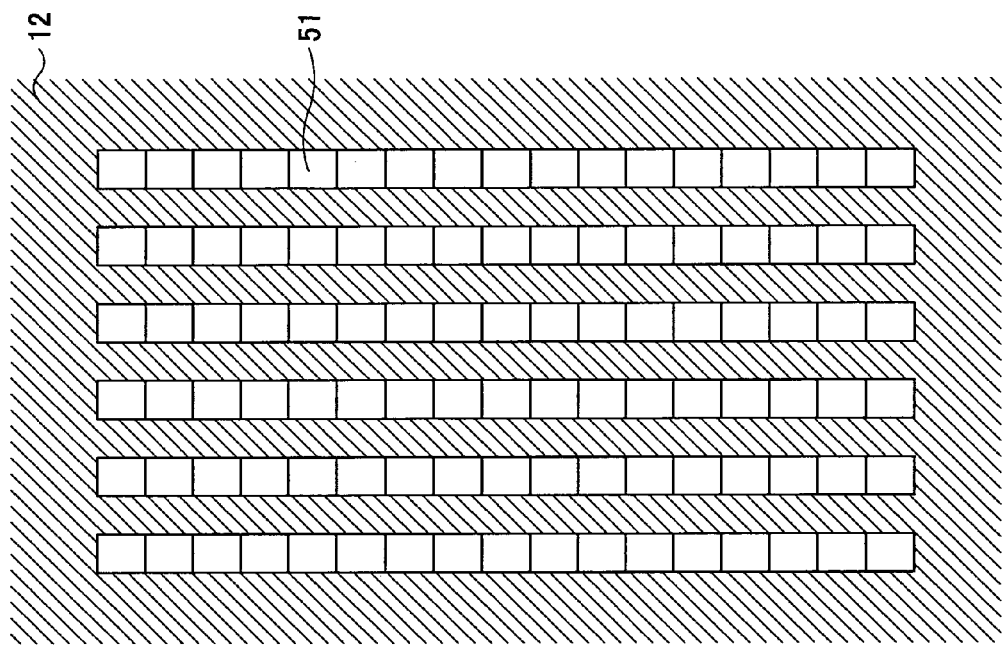

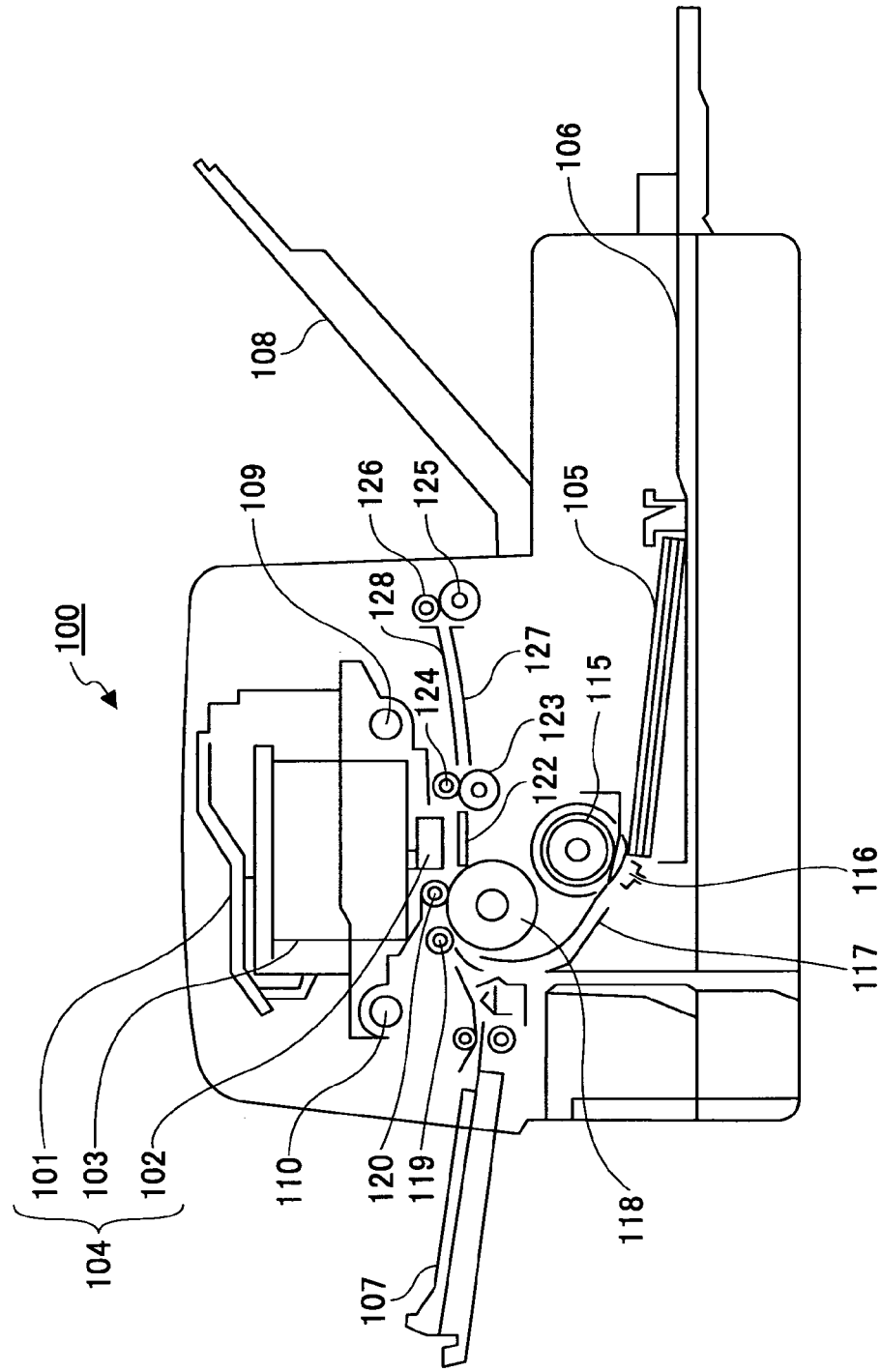

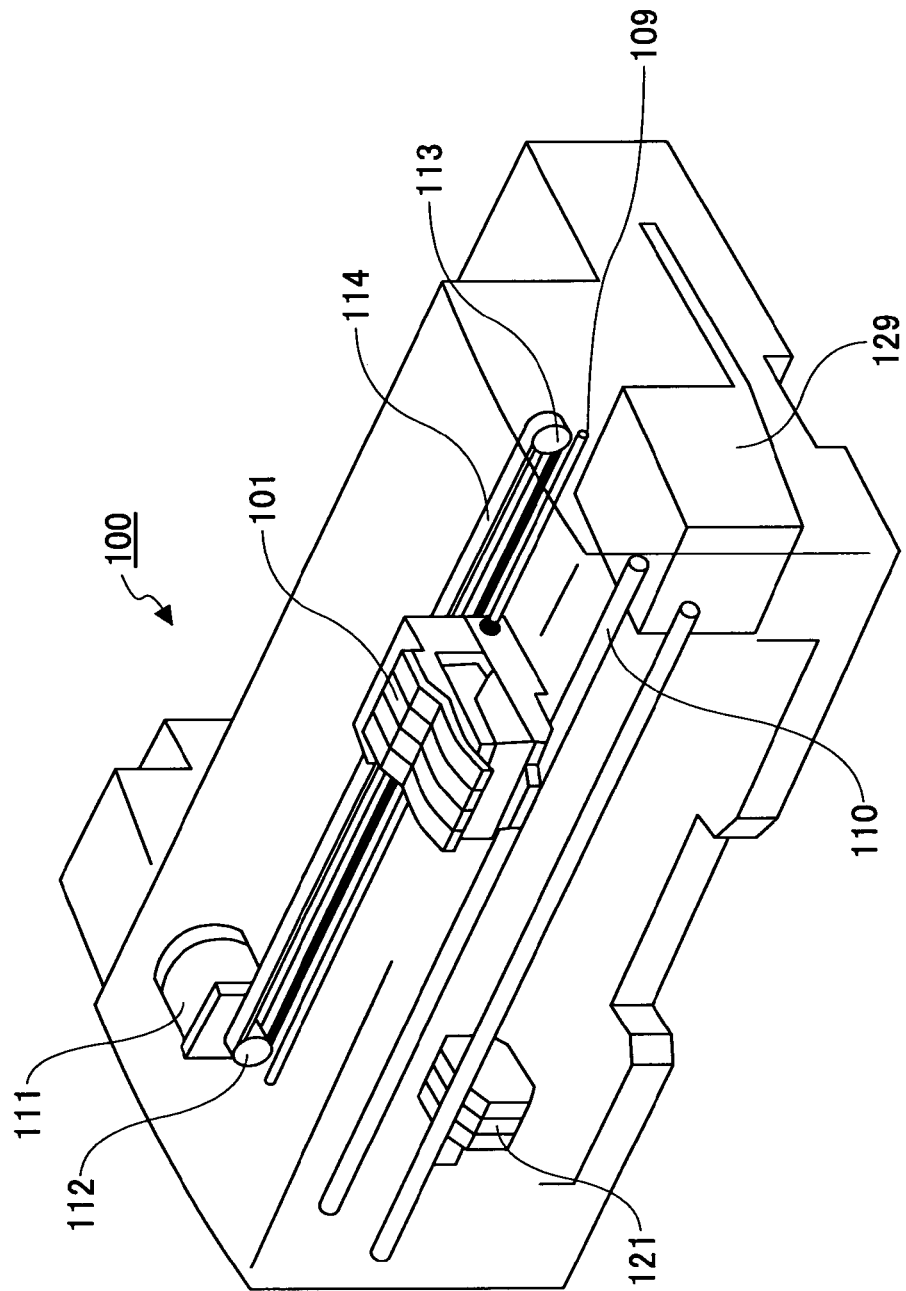

METHOD FOR PRODUCING ELECTROMECHANICAL TRANSDUCER, ELECTROMECHANICAL TRANSDUCER PRODUCED BY THE METHOD, LIQUID-DROPLET JETTING HEAD, AND LIQUID-DROPLET JETTING APPARATUS

TECHNICAL FIELD

A certain aspect of the present invention relates to a method of producing an electromechanical transducer, the electromechanical transducer produced by the method, a liquid-droplet jetting head, and a liquid-droplet jetting apparatus.

BACKGROUND ART

Inkjet recording apparatuses generate very low noise, can print images at high speed, and can use a variety of inks and inexpensive plain paper. Because of these advantages, inkjet recording apparatuses are widely used as image recording apparatuses or image forming apparatuses such as a printer, a facsimile machine, and a copier. An inkjet recording apparatus or a liquid-droplet jetting apparatus includes a nozzle for jetting ink droplets; a liquid chamber including a discharge chamber connected to the nozzle, a pressurized liquid chamber, a pressure chamber, and an ink channel; and a pressure generating unit for causing ink in the liquid chamber to be discharged. Examples of pressure generating units include a piezoelectric-type pressure generating unit that uses an electromechanical transducer such as a piezoelectric element to deform or displace a vibrating plate forming a wall of the discharge chamber and thereby to cause ink to be discharged; and a bubble-type (thermal-type) pressure generating unit that uses an electrothermal converting element such as a heat element in the discharge chamber to generate air bubbles by film boiling of ink and thereby to cause the ink to be discharged. There are various types of piezoelectric-type pressure generating units such as a longitudinal vibration type employing deformation in the d33 direction; a transverse vibration (bend mode) type employing deformation in the d31 direction; and a shear mode type employing shear deformation. Also, with the advancement in semiconductor processes and microelectromechanical systems (MEMS), a thin-film actuator produced by forming a liquid chamber and a piezoelectric element directly on an Si substrate has been proposed.

An electromechanical transducer used for the piezoelectric-type pressure generating unit includes a lower electrode (first electrode), an electromechanical transduction layer, and an upper electrode (second electrode) that are stacked on each other. With this configuration, a piezoelectric element for generating pressure to discharge ink is provided for each pressure chamber. The electromechanical transduction layer is made of, for example, lead zirconate titanate (PZT) ceramic that includes multiple metal oxides as major components and is generally called a metal composite oxide.

In a related-art method of forming an electromechanical transducer for each pressure chamber, an electromechanical transduction layer is formed on a lower electrode using a known deposition method such as a vacuum deposition method (e.g., sputtering, metallo-organic compound chemical vapor deposition (MO-CVD), vacuum evaporation, or ion plating), a sol-gel method, a hydrothermal synthesis method, an aerosol deposition (AD) method, or a metal organic decomposition (MOD) method. Next, an upper electrode is formed on the electromechanical transduction layer. Then, the upper electrode, the electromechanical transduction layer, and the lower electrode are patterned by photolithography and etching. Here, it is not easy to process a metal composite oxide, particularly PZT, by dry etching. While an Si semiconductor device can be easily processed by reactive ion etching (RIE), a special RIE method, where ICP plasma, ECR plasma, and helicon plasma are used in combination to increase plasma energy of ionic species, is required to process a metal composite oxide. Such a method increases the costs of a production apparatus. Also, with this method, it is difficult to achieve a sufficient selection ratio with respect to an underlying electrode film. Particularly, with a large-area substrate, non-uniformity in the etching rate is critical. Although an etching step may be omitted by forming an etching-resistant PZT film only in desired areas, such a method has not been tried sufficiently.

For the above reasons, several methods for selectively forming a PZT film have been proposed.

One of the methods is a hydrothermal synthesis method where PZT is selectively grown on Ti metal. This method makes it possible to grow a PZT film only on a patterned Ti electrode. To obtain a PZT film with a sufficient pressure resistance by this method, the thickness of the PZT film is preferably 5 μm or greater. If the thickness is less than 5 μm, dielectric breakdown may easily occur when an electric field is applied to the PZT film.

Another one of the methods is a vacuum deposition method that is used, for example, to form a patterned luminescent layer using a shadow mask in the production of an organic EL display. With this method, a PZT film is formed at a substrate temperature of 500-600° C. The substrate temperature of 500-600° C. is necessary to crystallize the composite oxide and thereby to induce piezoelectricity.

Still another one of the methods is an aerosol deposition (AD) method where a resist pattern is formed in advance by photolithography and a PZT film is formed in areas without the resist film. Similar to the hydrothermal synthesis method, the AD method is suitable for forming a thick film. With this method, a PZT film is also deposited on the resist film. Therefore, a lift-off step is performed after removing a part of the deposited film by grinding.

Further, there is a liquid-droplet jetting method where a PZT precursor is applied at high resolution.

However, with the hydrothermal synthesis method, it is difficult to form a thin film with a desired thickness. Also, when forming a device on an Si substrate with the hydrothermal synthesis method, it is necessary to protect the Si substrate because the hydrothermal synthesis occurs in a strong alkaline aqueous solution. With the vacuum deposition method, because of a difference in the thermal expansion rate between the Si substrate and the shadow mask, which is normally made of stainless steel, it is difficult to effectively mask the Si substrate. Also, a disposable shadow mask is impractical. Particularly, a disposable shadow mask is not suitable for the MO-CVD method and the sputtering method where wraparound of a deposited film tends to easily occur. The AD method is not suitable for forming a thin film with a thickness less than 5 μm. Also, it is difficult to uniformly grind a large area. Further, since the resist film has a low heat resistance, it is necessary to perform aerosol deposition at the ambient temperature and to convert the deposited film to a film having piezoelectricity through a post-annealing process. With the liquid-droplet jetting method, since the amount of the PZT precursor liquid applied to a platinum surface is very small, the liquid tends to dry quickly. Also, at an edge of an application area where the vapor concentration of a solvent evaporated from the small amount of liquid is low, the liquid tends to dry quickly. The difference in the drying rate of the PZT precursor liquid between different areas of the platinum surface results in uneven thickness of an electromechanical transduction film which in turn degrades the electrical characteristics of an electromechanical transducer.

SUMMARY OF THE INVENTION

An aspect of the present invention provides a method of producing an electromechanical transducer. The method includes a first step of partially modifying a surface of a first electrode; a second step of applying a sol-gel liquid including a metal composite oxide to a predetermined area of the partially-modified surface of the first electrode; a third step of performing drying, thermal decomposition, and crystallization on the applied sol-gel liquid to form an electromechanical transduction film; a fourth step of repeating the first, second, and third steps to obtain the electromechanical transduction film with a desired thickness; and a fifth step of forming a second electrode on the electromechanical transduction film.

BRIEF DESCRIPTION OF DRAWINGS

FIG. 8 is a cut-away side view of a liquid-droplet jetting head including an electromechanical transducer produced by a production method according to an embodiment of the present invention;

FIG. 14A is a drawing illustrating different portions of a PZT precursor solution joining on hydrophobic surfaces in a pattern due to surface tension;

FIG. 14B is a drawing illustrating a PZT film after heat treatment;

FIGS. 16A and 16B are drawings illustrating exemplary dummy patterns of a PDMS stamp;

FIGS. 19A and 19B are drawings illustrating a configuration of a liquid-droplet jetting apparatus according to another embodiment of the present invention.

DESCRIPTION OF EMBODIMENTS

Figure 1A:
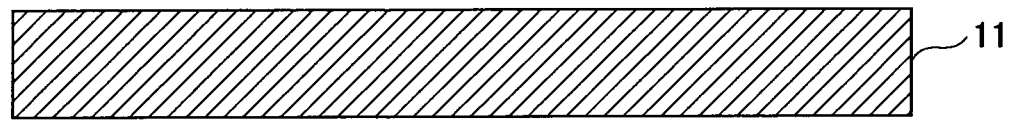
FIGS. 1A through 1F are drawings illustrating a production process of an electromechanical transducer according to a first embodiment of the present invention.

Preferred embodiments of the present invention are described below with reference to the accompanying drawings.

First, basic facts and assumptions related to the embodiments of the present invention are described. In the descriptions below, an electromechanical transducer of a transverse vibration (bend mode) type employing deformation in the d31 direction is used as an example. When an electromechanical transduction layer is made of PZT, as described in K. D. Budd, S. K. Dey, D. A. Payne, Proc. Brit. Ceram. Soc. 36, 107 (1985), lead acetate, zirconium alkoxide, and a titanium alkoxide compound are used as starting materials and dissolved in methoxyethanol used as a common solvent to obtain a homogeneous solution. This homogeneous solution is called a PZT precursor solution. PZT is a solid solution including lead zirconate ($PbZrO_3$) and lead titanate ($PbTiO_3$). The characteristics of PZT vary depending on the ratio between $PbZrO_3$ and $PbTiO_3$. Generally, a composition where the ratio of $PbZrO_3$ to $PbTiO_3$ is 53:47 shows a superior piezoelectric property. PZT with this composition is represented by a chemical formula $Pb(Zr0.53,Ti0.47)O_3$ and is more generally indicated by PZT(53/47). Lead acetate, zirconium alkoxide, and a titanium alkoxide compound used as the starting materials are weighed according to this chemical formula. A metal alkoxide compound is easily hydrolyzed by moisture in the atmosphere. Therefore, an appropriate amount of a stabilizer such as acetylacetone, acetic acid, or diethanolamine may be added to the PZT precursor solution. A composite oxide other than PZT, such as barium titanate, may be used instead. In this case, barium alkoxide and a titanium alkoxide compound are used as starting materials and dissolved in a common solvent to prepare a barium titanate precursor solution.

When forming an electromechanical transduction layer on the entire surface of a substrate used as a foundation layer, the PZT precursor solution is applied by a solution applying method such as spin coating to form a PZT film, and heat treatment including solvent drying, thermal decomposition, and crystallization is performed on the PZT film. When the PZT film is crystallized, volume shrinkage occurs. Therefore, to obtain a film with no cracks, it is necessary to adjust the precursor concentration such that the thickness of the film obtained by a single process becomes 100 nm or less. If the electromechanical transducer is used for a liquid jetting apparatus, the thickness of the PZT film is preferably between 1 µm and 2 µm. To achieve a film thickness of 1-2 µm with the above method, it is necessary to repeat the process more than ten times.

When forming a patterned electromechanical transduction layer by a sol-gel method, it is necessary to selectively apply a PZT precursor solution to a substrate used as a foundation layer by controlling the wettability of the substrate. In A. Kumar and G. M. Whitesides, Appl. Phys. Lett., 63, 2002

(1993), a phenomenon where alkanethiol self-assembles on a particular metal is described. For example, thiol forms a self assembled monolayer (SAM) film on a platinum metal. In this method, a SAM film is formed on the entire surface of a lower electrode made of platinum. Since alkyl groups are arrayed on the SAM film, the SAM film has a hydrophobic nature. The SAM film is patterned using a photoresist by known photolithography and etching methods. The patterned SAM film remains after the resist is removed. Areas where the SAM film remains have a hydrophobic nature. Meanwhile, areas where the SAM film has been removed, i.e., the platinum surface, have a hydrophilic nature. The PZT precursor solution is selectively applied by using this contrast in the surface energy. Although it depends on the degree of contrast, it may be possible to selectively apply the PZT precursor solution to form a patterned PZT film even by a spin coating method. Also, a doctor blade method or a dip coating method may be used. An inkjet method is preferable to reduce the amount of PZT precursor solution used. Further, a letterpress method may be used. Production methods of an electromechanical transducer according to embodiments of the present invention are described below based on the basic facts and assumptions described above.

Figure 1B:
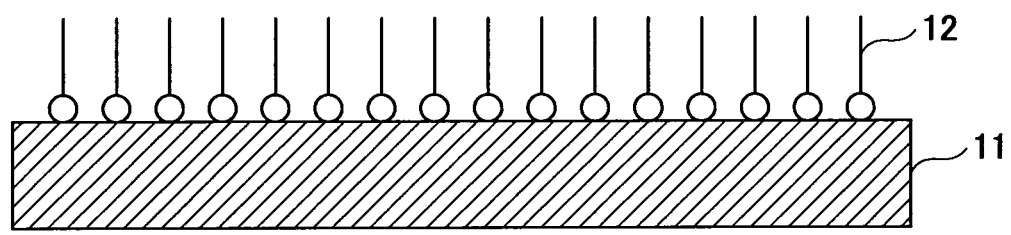
Figure 1C:
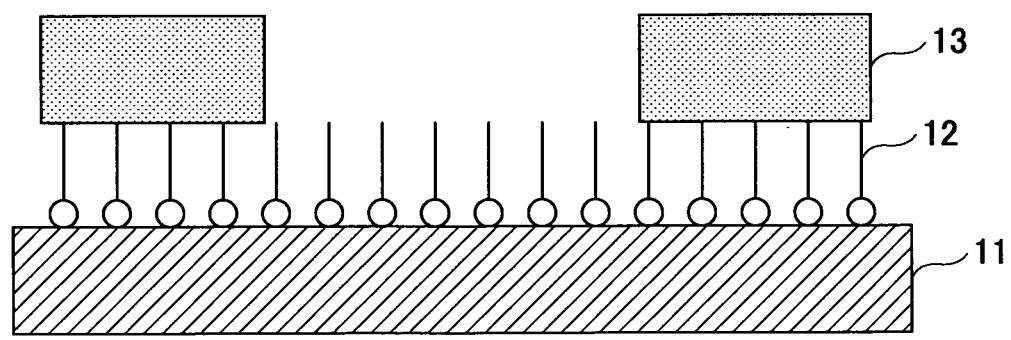
Figure 1D:
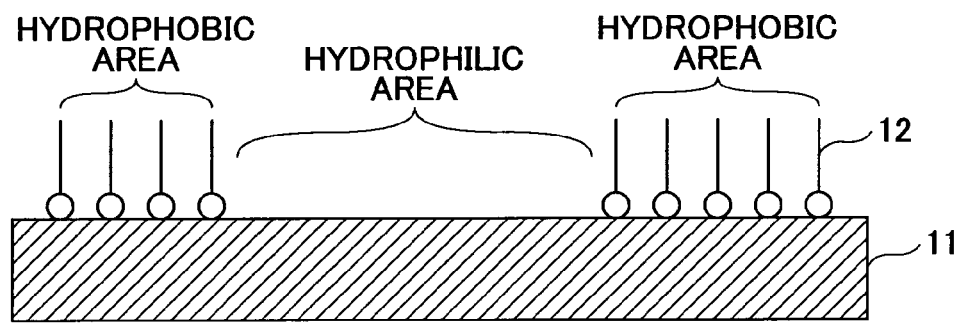
Figure 1E:
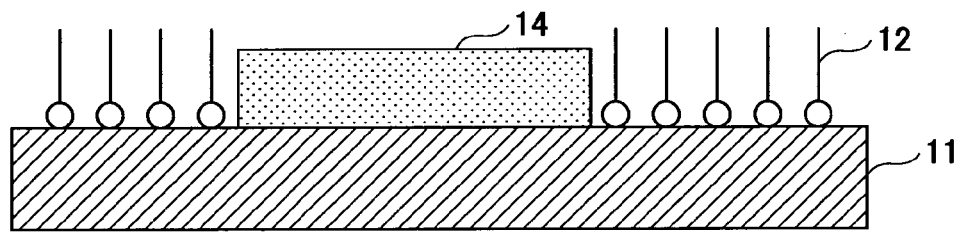
Figure 1F:
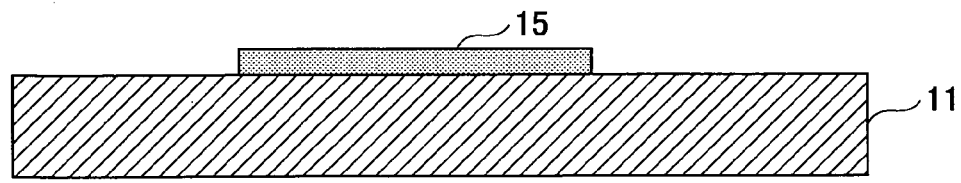
Figure 10:
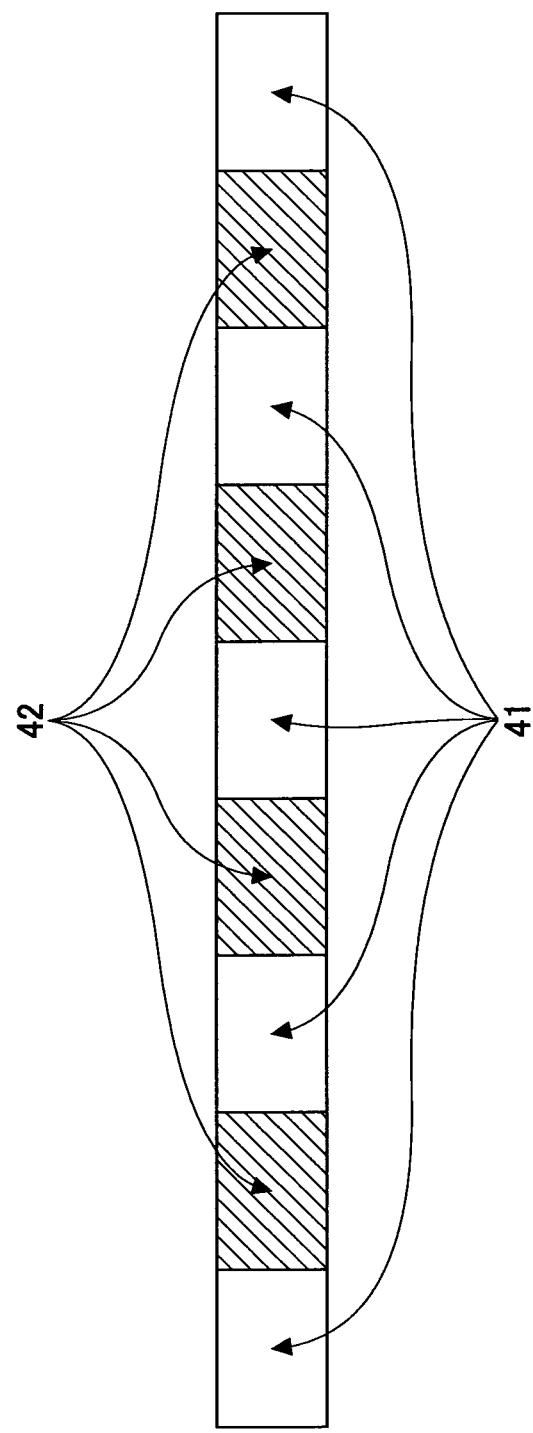
FIG. 10 is a drawing illustrating a rectangular pattern defining application areas.

FIGS. 1A through 1F are drawings illustrating a production process of an electromechanical transducer according to a first embodiment of the present invention. Here, it is assumed that a substrate surface is made of platinum that is highly reactive to thiol. The reactivity and hydrophobicity (repellency) of alkanethiol vary depending on its molecular chain length. In this example, molecules of alkanethiol with a chain length of C6-C18 are dissolved in a commonly-used organic solvent (e.g., alcohol, acetone, or toluene) to prepare a solution (concentration: several mol/l). As shown by FIGS. 1A and 1B, a substrate 11 is immersed in the solution and taken out of the solution after a predetermined period of time; excess molecules are removed by displacement washing using a solvent; and the solution is dried to form a SAM film 12 on the platinum surface. Next, a patterned photoresist 13 is formed by photolithography as shown by FIG. 10; and the SAM film 12 is patterned as shown by FIG. 1D by removing a part of the SAM film 12 by dry etching and removing the photoresist 13. Next, a PZT precursor solution is applied by a solution applying method such as spin coating. As shown by FIG. 1E, a PZT film 14 is formed on a hydrophilic area without the SAM film 12 but not on a hydrophobic area where the SAM film 12 exists. Then, heat treatment including solvent drying, thermal decomposition, and crystallization is performed to obtain an electromechanical transduction film 15 as shown by FIG. 1F.

Figure 2A:
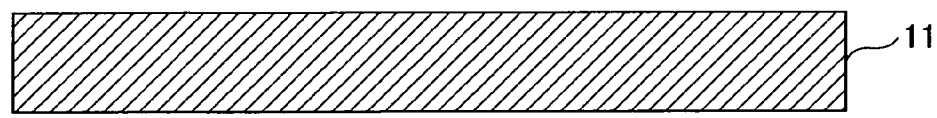
FIGS. 2A through 2F are drawings illustrating a production process of an electromechanical transducer according to a second embodiment of the present invention.
Figure 2B:
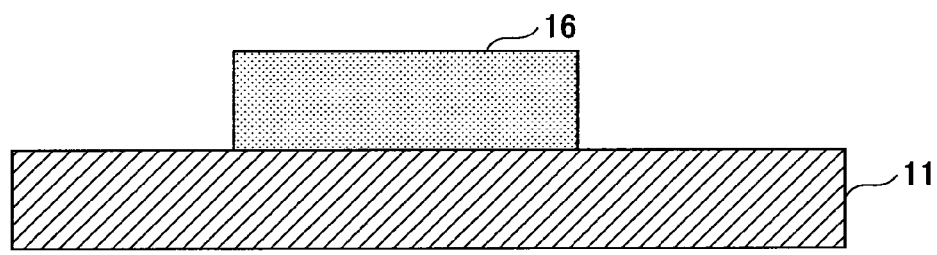
Figure 2C:
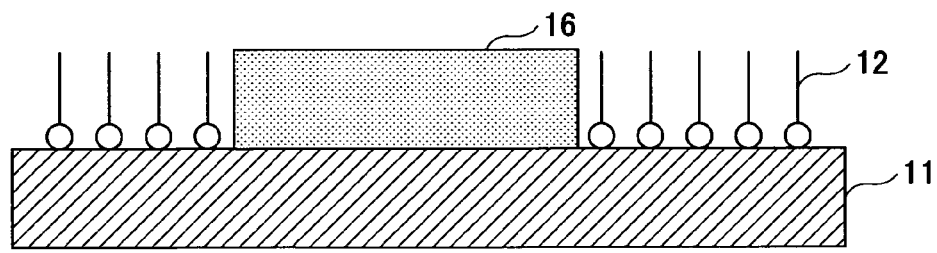
Figure 2D:
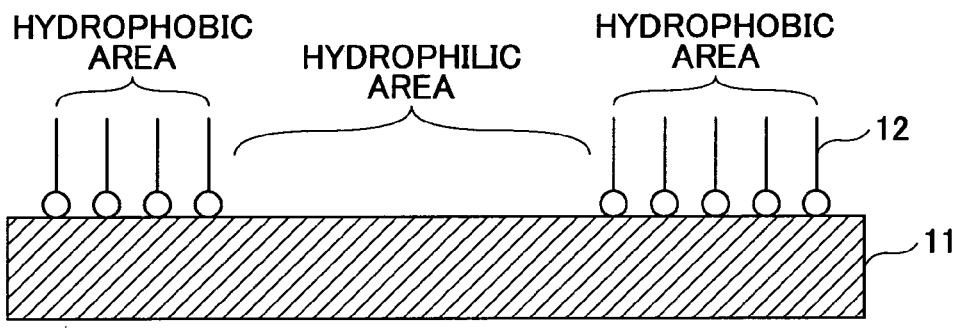
Figure 2E:
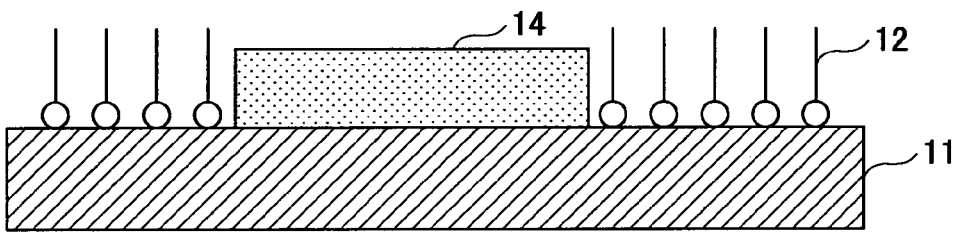
Figure 2F:
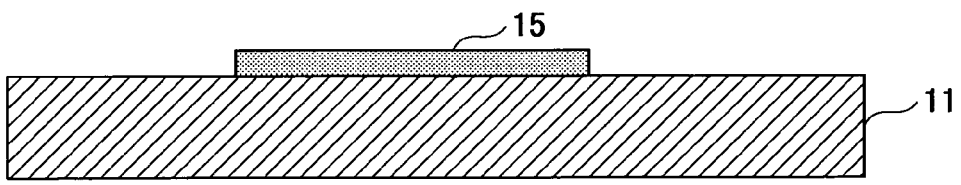

FIGS. 2A through 2F are drawings illustrating a production process of an electromechanical transducer according to a second embodiment of the present invention. In FIGS. 2A through 2F, the same reference numbers are used to indicate components that are the same as those of FIGS. 1A through 1F. As shown by FIGS. 2A and 2B, a photoresist pattern is formed using a photoresist 16; and as shown by FIG. 2C, a SAM film 12 is formed. The SAM film 12 is not formed on the photoresist 16 that is hydrophobic. Next, as shown by FIG. 2D, the photoresist 16 is removed. As a result, a patterned SAM film 12 is obtained. Next, a PZT precursor solution is applied by a solution applying method such as spin coating. As shown by FIG. 2E, a PZT film 14 is formed on a hydrophilic area without the SAM film 12 but not on a hydrophobic area where the SAM film 12 exists. Then, heat treatment including solvent drying, thermal decomposition, and crystallization is performed to obtain an electromechanical transduction film 15 as shown by FIG. 2F.

Figure 3A:
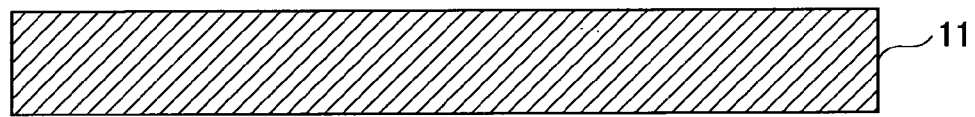
FIGS. 3A through 3F are drawings illustrating a production process of an electromechanical transducer according to a third embodiment of the present invention.
Figure 3B:
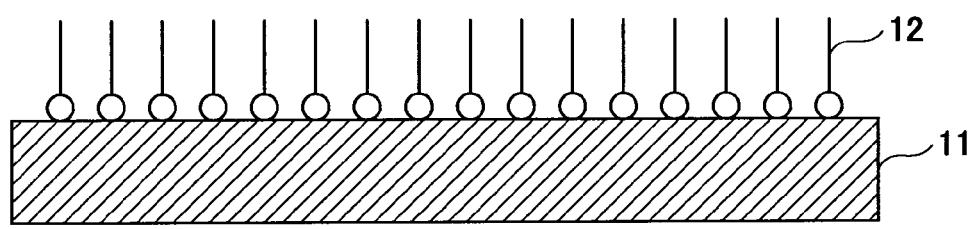
Figure 3C:
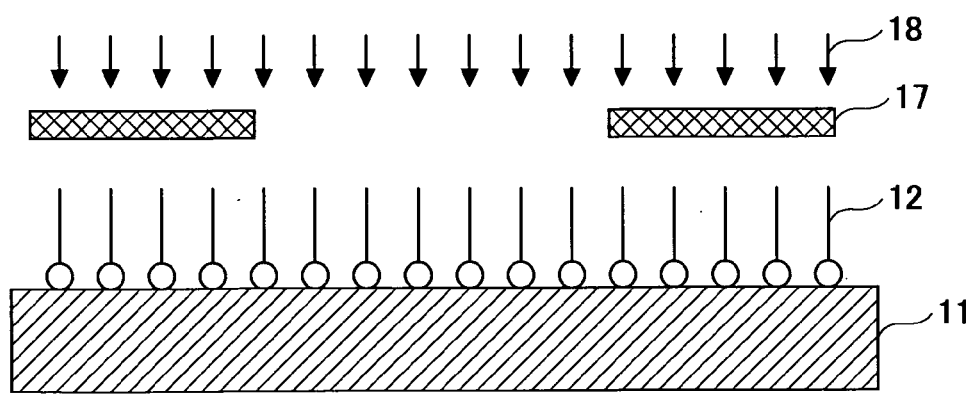
Figure 3D:
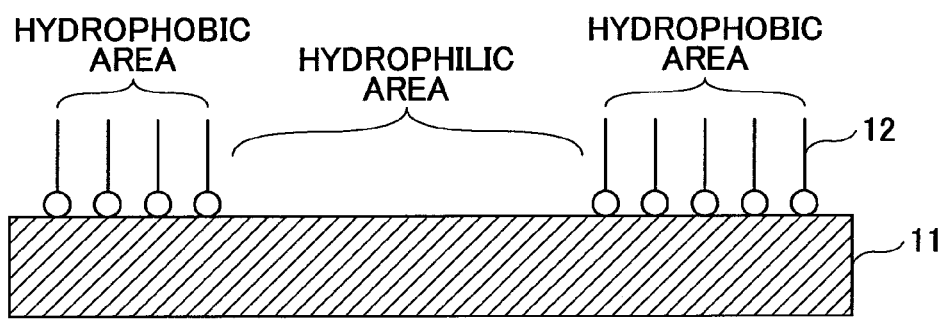
Figure 3E:
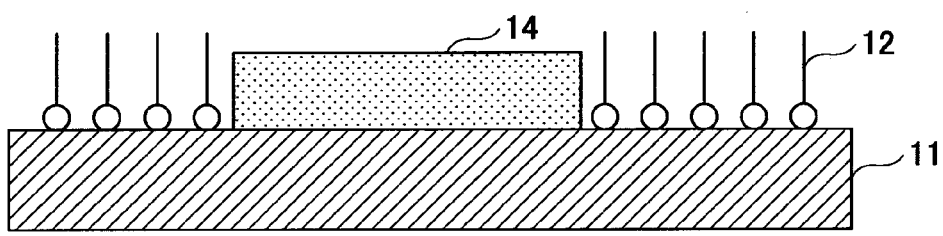
Figure 3F:
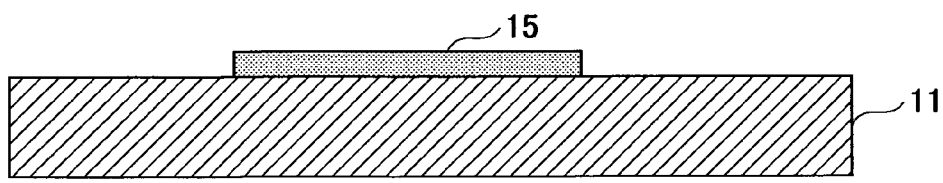

FIGS. 3A through 3F are drawings illustrating a production process of an electromechanical transducer according to a third embodiment of the present invention. In FIGS. 3A through 3F, the same reference numbers are used to indicate components that are the same as those of FIGS. 1A through 1F. As shown by FIGS. 3A and 3B, a SAM film 12 is formed on the platinum surface of a substrate 11. As shown by FIG. 3C, the SAM film 12 is illuminated by ultraviolet rays 18 through a patterned mask 17. As shown by FIG. 3D, the SAM film 12 in unexposed areas remains and the SAM film 12 in an exposed area disappears. Next, a PZT precursor solution is applied by a solution applying method such as spin coating. As shown by FIG. 3E, a PZT film 14 is formed on a hydrophilic area without the SAM film 12 but not on a hydrophobic area where the SAM film 12 exists. Then, heat treatment according to a normal sol-gel process is performed. The heat treatment is performed at high temperatures such as an organic matter burning temperature of 400-500° C. and a PZT crystallization temperature of 600-700° C. As a result, the SAM film 12 disappears and an electromechanical transduction film 15 is obtained as shown by FIG. 3F.

Figure 4A:
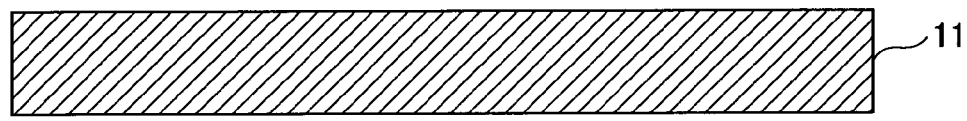
FIGS. 4A through 4F are drawings illustrating a production process of an electromechanical transducer according to a fourth embodiment of the present invention.
Figure 4B:
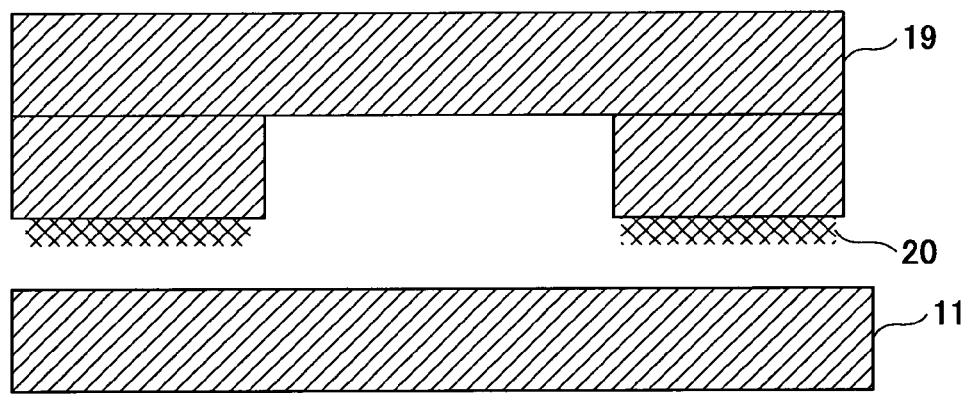
Figure 4C:
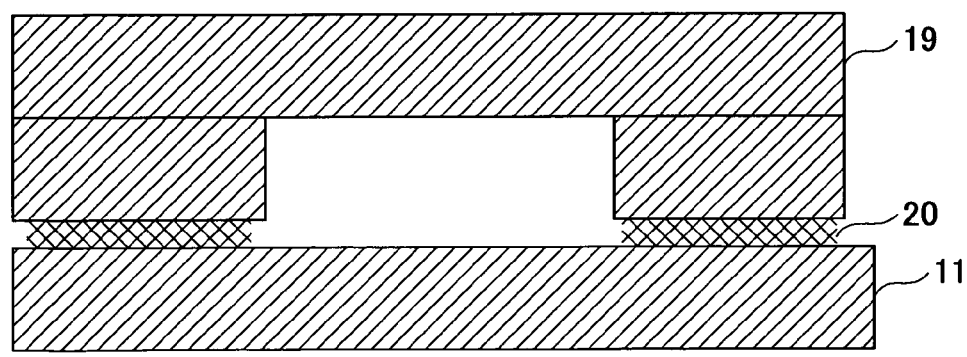
Figure 4D:
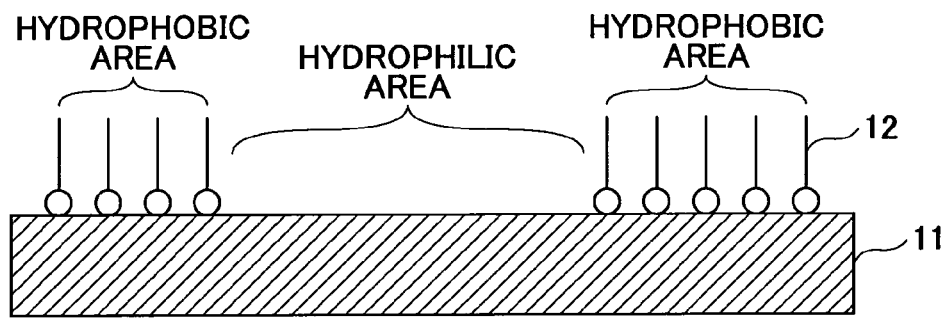
Figure 4E:
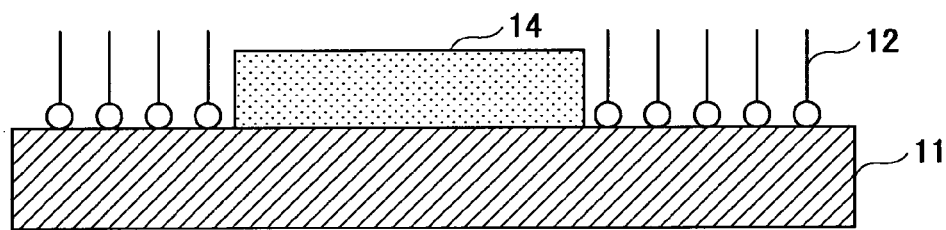
Figure 4F:
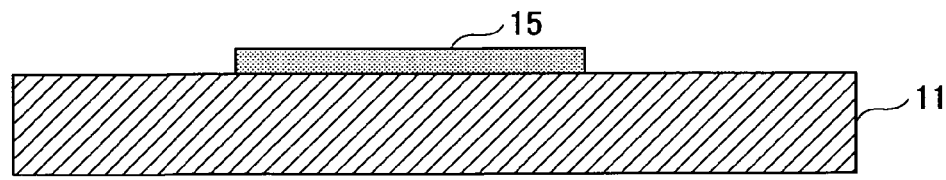

FIGS. 4A through 4F are drawings illustrating a production process of an electromechanical transducer according to a fourth embodiment of the present invention. In FIGS. 4A through 4F, the same reference numbers are used to indicate components that are the same as those of FIGS. 1A through 1F. As shown by FIGS. 4A and 4B, a solution 20 used as a SAM film material is applied, by dip coating or spin coating, to a PDMS stamp 19 that is patterned in advance by, for example, photolithography. Next, the PDMS stamp 19 is brought into contact with a substrate 11 as shown by FIG. 4C to form a patterned SAM film 12 on the substrate 11 as shown by FIG. 4D (this method is called micro-contact printing). Next, a PZT precursor solution is applied by a solution applying method such as spin coating. As shown by FIG. 4E, a PZT film 14 is formed on a hydrophilic area without the SAM film 12 but not on a hydrophobic area where the SAM film 12 exists. Then, heat treatment including solvent drying, thermal decomposition, and crystallization is performed to obtain an electromechanical transduction film 15 as shown by FIG. 4F. The production method of the fourth embodiment makes it possible to omit a patterning step (photolithography step) on a substrate and thereby makes it possible to improve the productivity. Also, when forming a SAM film by contact printing, the SAM film can be easily aligned because of the wet of alkanethiol itself.

Figure 5A:
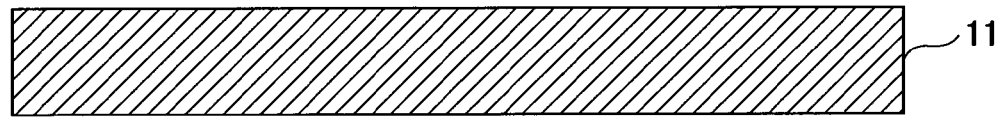
FIGS. 5A through 5F are drawings illustrating a production process of an electromechanical transducer according to a fifth embodiment of the present invention.
Figure 5B:
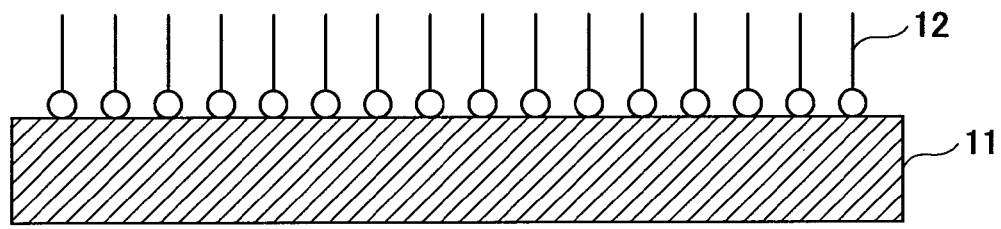
Figure 5C:
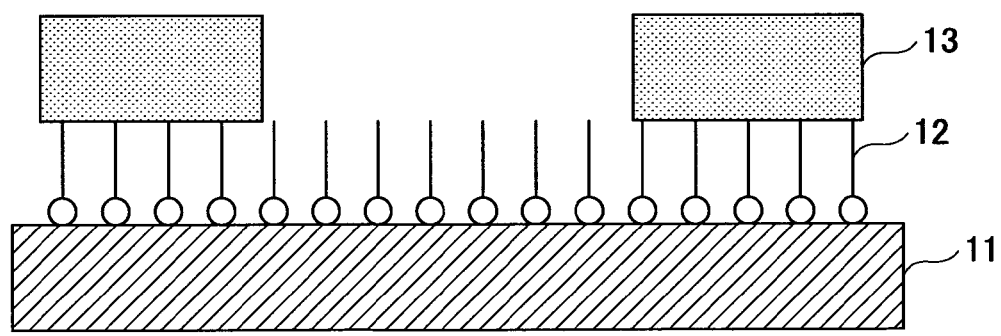
Figure 5D:
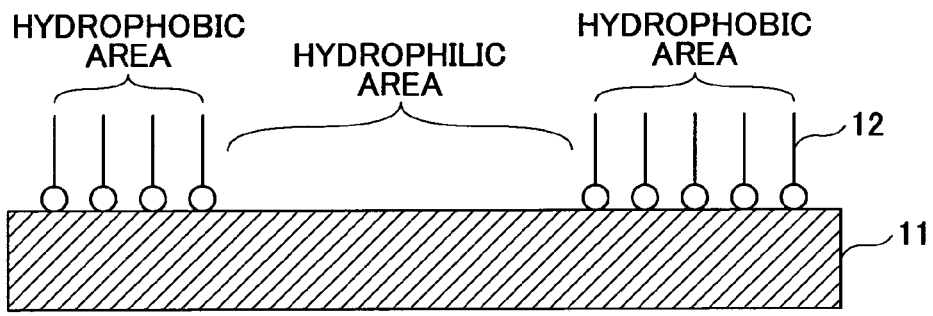
Figure 5E:
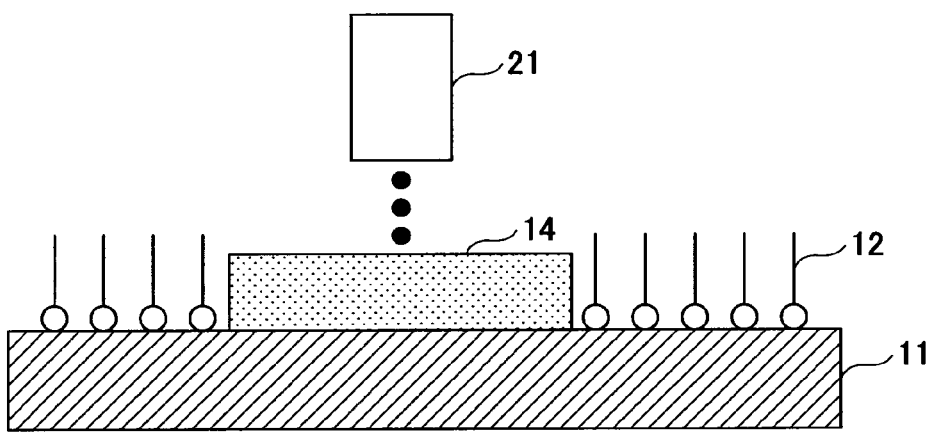
Figure 5F:
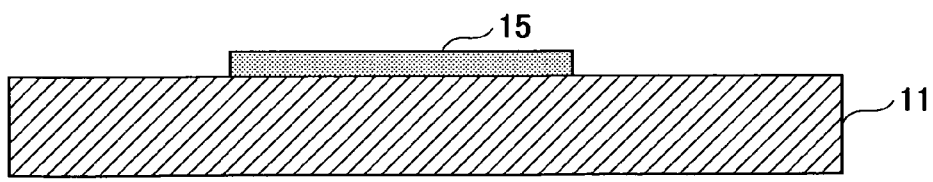

FIGS. 5A through 5F are drawings illustrating a production process of an electromechanical transducer according to a fifth embodiment of the present invention. In FIGS. 5A through 5F, the same reference numbers are used to indicate components that are the same as those of FIGS. 1A through 1F. As shown by FIGS. 5A and 5B, a SAM film 12 is formed on the platinum surface of a substrate 11. Next, a patterned photoresist 13 is formed by photolithography as shown by FIG. 5C; and the SAM film 12 is patterned as shown by FIG. 5D by removing a part of the SAM film 12 by dry etching and removing the photoresist 13. Next, as shown by FIG. 5E, a PZT film 14 is formed by applying a PZT precursor solution with a liquid-droplet jetting head 21 only to a hydrophilic area without the SAM film 12. Then, heat treatment including solvent drying, thermal decomposition, and crystallization is performed to obtain an electromechanical transduction film 15 as shown by FIG. 5F. The thickness of the electromechanical transduction film 15 obtained by a single film-forming process is preferably about 100 nm. To achieve this thickness, the precursor concentration is optimized based on a film forming area and the amount of precursor to be applied. As shown in FIG. 5E, the precursor solution applied by the liquid-droplet jetting head 21 spreads only in the hydrophilic area and forms a pattern because of the contrast in the contact angle. In an experiment, the formed pattern (the PZT film 14) was heat-treated at 120° C. (solvent drying) and thermal decomposition of organic matter was performed. As a result, an electromechanical transduction film with a thickness of 90 nm was obtained.

Figure 6A:
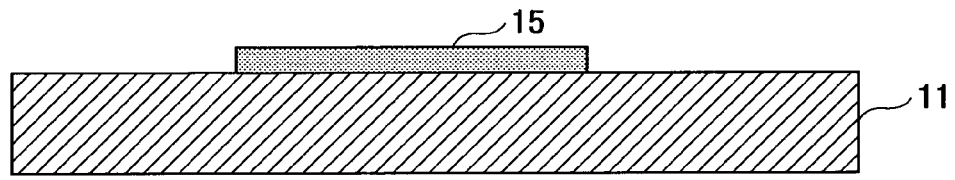
FIGS. 6A through 6D are drawings illustrating a production process of an electromechanical transducer according to a sixth embodiment of the present invention.
Figure 6B:
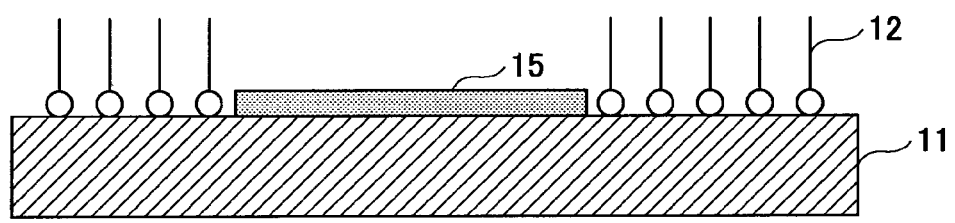
Figure 6C:
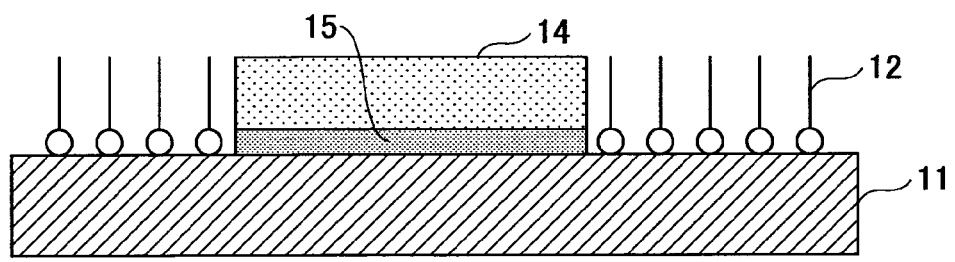
Figure 6D:
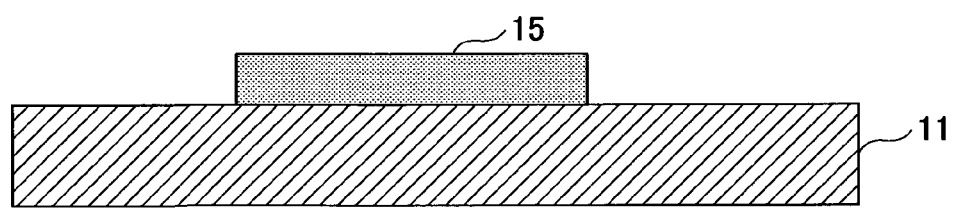

FIGS. 6A through 6D are drawings illustrating a production process of an electromechanical transducer according to a sixth embodiment of the present invention. In FIGS. 6A through 6D, the same reference numbers are used to indicate components that are the same as those of FIGS. 1A through 1F. As shown by FIGS. 6A and 6B, a SAM film 12 is formed on a sample (the substrate 11 on which the electromechanical transduction film 15 is formed) prepared by any one of the production methods of the first through fifth embodiments. Next, a PZT precursor solution is applied by a solution applying method such as spin coating. As shown by FIG. 6C, a PZT film 14 is formed on the electromechanical transduction film 15 but not on the SAM film 12 that is hydrophobic. In other words, the substrate 11 is selectively coated by the PZT precursor solution. Then, heat treatment is performed and the thickness of the electromechanical transduction film 15 is increased as shown by FIG. 6D. Steps indicated by FIGS. 6A through 6D are repeated until a desired film thickness is obtained. With this method, it is possible to form an electromechanical transduction film with a thickness of up to about 5 μm. Thus, the second and succeeding film forming processes can be simplified because of the reasons described below. First, a SAM film cannot be formed on an oxide thin film. Therefore, a SAM film is formed only on an exposed platinum surface of the substrate where no PZT film is formed in the previous film forming process according to any one of the first through fifth embodiments. Using this self-assembly of molecules makes it possible to simplify the film forming process. Unlike a method where a step of forming a patterned SAM film and a step of forming a patterned high-performance color material film (e.g., color filter, polymer organic EL, or nano metal wire) using the patterned SAM film are performed only once, a film forming process needs to be repeated multiple times in a sol-gel method where the thickness of a film that can be formed by one cycle of the film forming process is small. Therefore, if a patterned SAM film is formed by photolithography and etching every time the film forming process is repeated, the entire production process becomes complicated. According to an aspect of the present invention, an electromechanical transducer includes an oxide thin film on which a SAM film cannot be formed and a lower electrode on which a SAM film can be formed. This configuration makes it possible to simplify the production process of an electromechanical transducer.

Figure 7A:
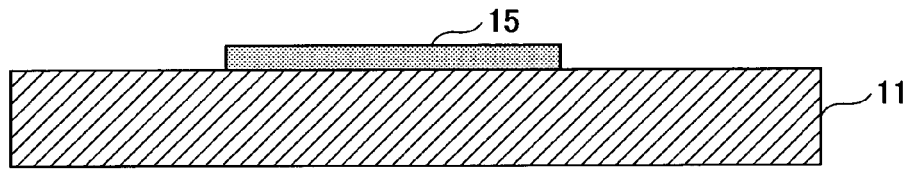
FIGS. 7A through 7D are drawings illustrating a production process of an electromechanical transducer according to a seventh embodiment of the present invention.
Figure 7B:
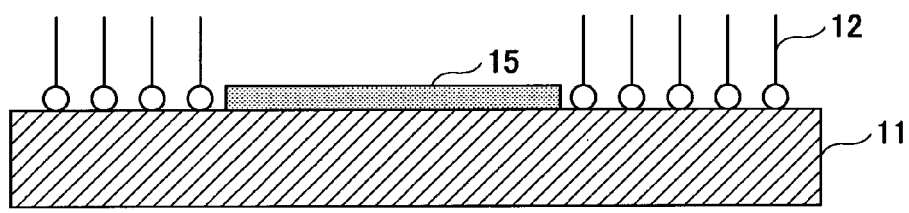
Figure 7C:
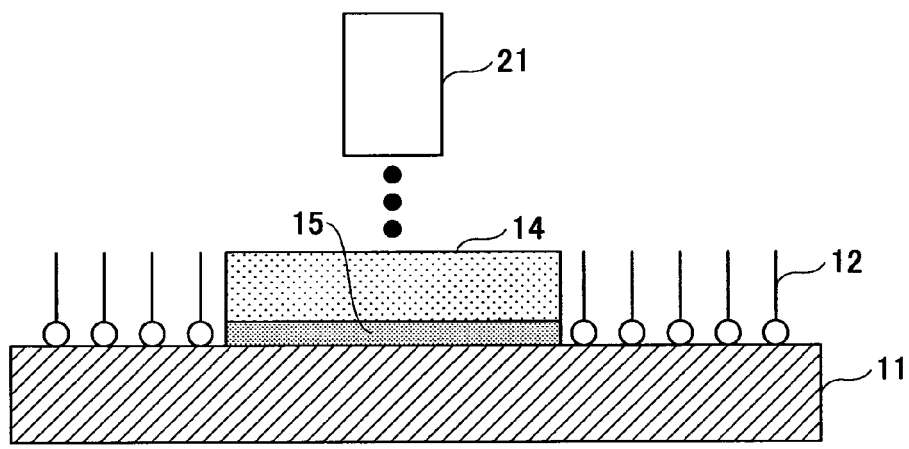
Figure 7D:
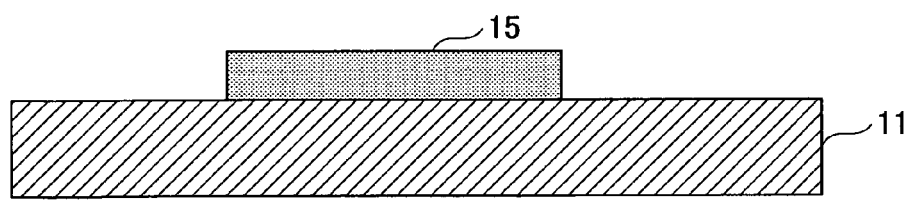

FIGS. 7A through 7D are drawings illustrating a production process of an electromechanical transducer according to a seventh embodiment of the present invention. In FIGS. 7A through 7D, the same reference numbers are used to indicate components that are the same as those of FIGS. 5A through 5F. As shown by FIGS. 7A and 7B, a SAM film 12 is formed on a sample (the substrate 11 on which the electromechanical transduction film 15 is formed) prepared by any one of the production methods of the first through fifth embodiments. Next, a PZT precursor solution is applied using a liquid-droplet jetting head 21. As shown by FIG. 7C, a PZT film 14 is formed on the electromechanical transduction film 15 but not on the SAM film 12 that is hydrophobic. In other words, the substrate 11 is selectively coated by the PZT precursor solution. Then, heat treatment is performed and the thickness of the electromechanical transduction film 15 is increased as shown by FIG. 7D. Steps indicated by FIGS. 7A through 7D are repeated until a desired film thickness is obtained.

FIG. 8 is a cut-away side view of a liquid-droplet jetting head including an electromechanical transducer produced by a production method according to an embodiment of the present invention. A liquid-droplet jetting head 30 shown in FIG. 8 includes an electromechanical transducer 34. The electromechanical transducer 34 includes a lower electrode 33, an electromechanical transduction film 32 formed on the lower electrode 33, and an upper electrode 31 formed on the electromechanical transduction film 32. The upper electrode 31 is formed, for example, by applying a platinum ink using a liquid-droplet jetting head. An adhesion layer 35 is formed on the lower electrode 33 of the electromechanical transducer 34, and a vibrating plate 36 is formed on the adhesion layer 35. The adhesion layer 35 is used to strengthen the film adhesion when a platinum metal lower electrode is formed on the vibrating plate 36. The liquid-droplet jetting head 30 further includes a pressure chamber substrate 37 that is an Si substrate and a nozzle plate 39 having a nozzle 38. The vibrating plate 36, the pressure chamber substrate 37, and the nozzle plate 39 form a pressure chamber 40. In FIG. 8, a liquid supplying unit, a liquid channel, and a fluid resistor are omitted.

As the material of the lower electrode 33, a heat-resistant metal with which alkanethiol reacts to form a SAM film may be used. Copper and silver allow a SAM film to be formed. However, since copper and silver are transmuted by heat treatment at or above 500° C. in the atmosphere, they cannot be used for the lower electrode 33. Gold fulfills the above requirements. However, gold cannot be used for the lower electrode 33 since it works against crystallization of a PZT film. Preferable materials for the lower electrode 33 include single metals such as platinum, rhodium, ruthenium, and iridium; and alloy materials, such as a platinum-rhodium alloy, that include platinum as a major component and another platinum group element. Preferable materials for the adhesion layer 35 include titanium, tantalum, titanium oxide, tantalum oxide, titanium nitride, tantalum nitride, and a laminated film of two or more of these materials. The thickness of the vibrating plate 36 is preferably about several micrometers. The vibrating plate 36 is preferably made of a silicon oxide film, a silicon nitride film, a silicon oxide nitride film, or a laminated film of two or more of these films. Also, taking into account the difference in the thermal expansion rate, a ceramic film such as an aluminum oxide film or a zirconia film may be used for the vibrating plate 36. The above materials for the vibrating plate 36 are insulators. Since the lower electrode 33 is electrically connected and used as a common electrode for inputting a signal to the electromechanical transducer 34, the vibrating plate 36 formed on the lower electrode 33 is preferably made of an insulator or an insulated conductor. For insulating a conductor, a thermally-oxidized or CVD-deposited silicon insulating film may be used. A metal oxide film may be formed by a sputtering method.

Figure 9:
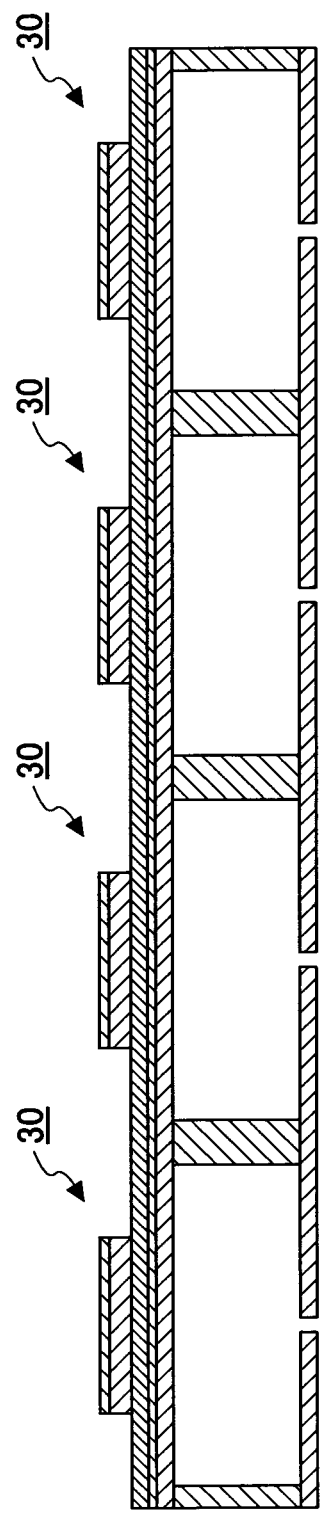
FIG. 9 is a drawing illustrating an array of liquid-droplet jetting heads of FIG. 8.

FIG. 9 is a drawing illustrating an array of liquid-droplet jetting heads of FIG. 8. As described above, embodiments of the present invention make it possible to produce electromechanical transducers having substantially the same performance as bulk ceramics with a simple production process. Liquid-droplet jetting heads are, for example, produced by forming pressure chambers on the electromechanical transducers by etching a pressure chamber substrate from the back surface and by bonding a nozzle plate having nozzle holes to the pressure chamber substrate. In FIG. 9, liquid supplying units, liquid channels, and fluid resistors are omitted.

Next, examples of the present invention are described below. A thermally-oxidized film (thickness: 1 micrometer) was formed on a silicon wafer and a titanium film (thickness: 50 nm) was formed as an adhesion layer on the thermally-oxidized film by sputter deposition. Next, a platinum film (thickness: 200 nm) was formed as a lower electrode on the titanium film by sputter deposition. A PDMS stamp having a fine pattern as shown in FIG. 4B was prepared. A solution with a concentration of 0.01 mol/l was prepared by dissolving alkanethiol represented by $CH_3(CH_2)_6$—SH in isopropyl alcohol. The solution was applied to the PDMS stamp by dip coating or spin coating. A patterned SAM film was formed on the platinum film by micro contact printing using the PDMS stamp. After the SAM film was formed, contact angles of water were measured to confirm hydrophobicity. The contact angle of water on the platinum film was 5 degrees or less (fully wet), and the contact angle of water on the SAM film was 92.2 degrees. A PZT precursor solution for a PZT (53/47) film was prepared as described below. Lead acetate trihydrate, titanium isopropoxide, and zirconium isopropoxide were used as starting materials of the PZT precursor solution. Water of crystallization of lead acetate was dissolved in methoxyethanol and dehydrated. The amount of lead was in excess of stoichiometry by 10 mol %. This is to prevent reduction in crystallinity due to the so-called lead discharge during heat treatment. Meanwhile, titanium isopropoxide and zirconium isopropoxide were dissolved in methoxyethanol, and alcohol exchange reaction and esterification reaction were accelerated. Then, the solution of lead acetate and the solution of titanium isopropoxide and zirconium isopropoxide were mixed to prepare the PZT precursor solution. The PZT concentration in the PZT precursor solution was 0.3 mol/l. The thickness of an electromechanical transduction film obtained by a single sol-gel deposition process is preferably about 100 nm. To achieve this thickness, the precursor concentration is optimized based on a film forming area and the amount of precursor to be applied. Therefore, the precursor concentration is not limited to 0.3 mol/l.

Figure 11:
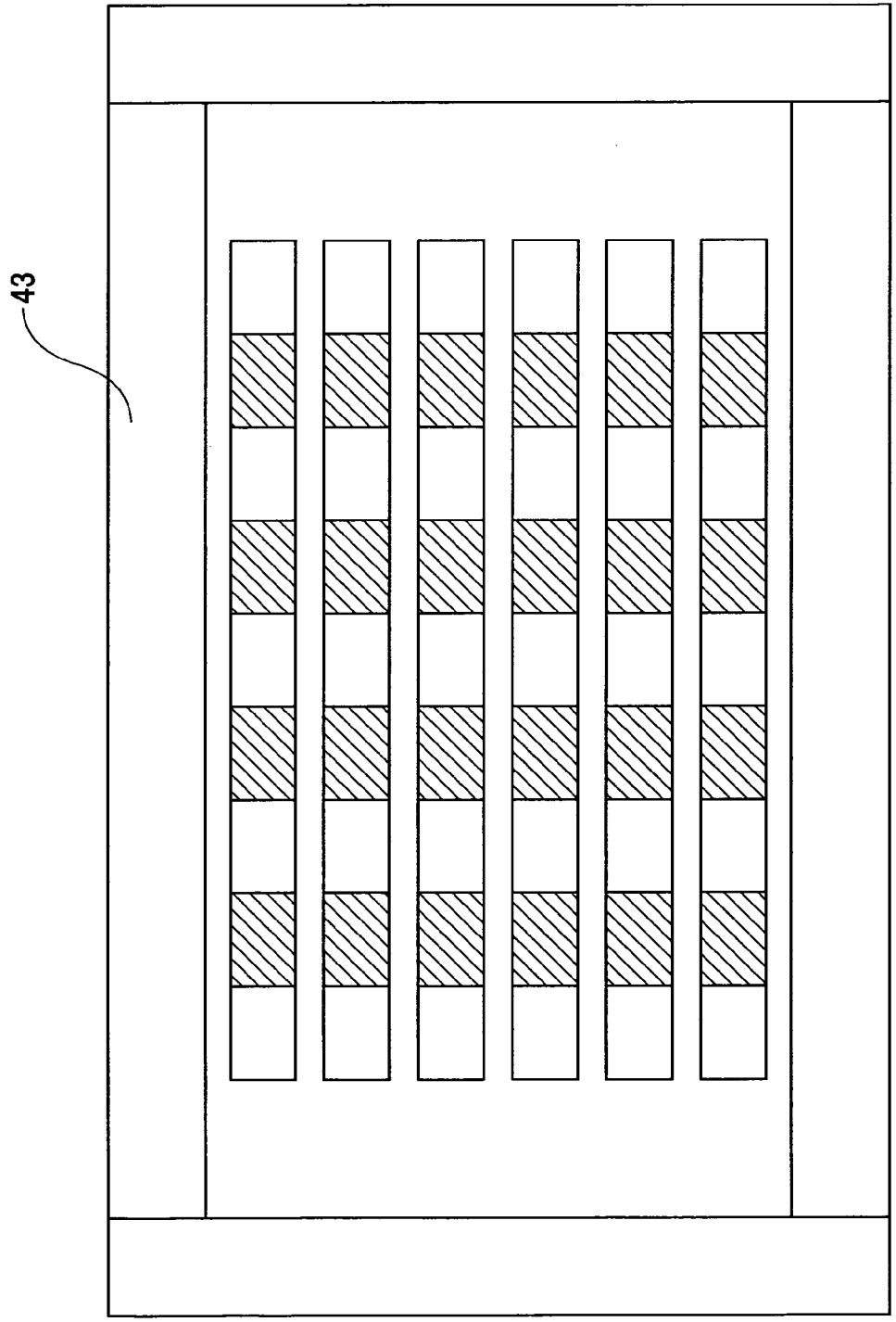
FIG. 11 is a drawing illustrating an example where rectangular patterns are arranged in the width direction.

The PZT precursor solution was applied to the patterned SAM film by spin coating as shown in FIG. 4E. The PZT film was not formed on a hydrophobic area where the SAM film exists due to the centrifugal force generated by spinning, but was formed on a hydrophilic area where the SAM film does not exist. The formed PZT film was heat-treated at 120° C. (solvent drying), and thermal decomposition of organic matter was performed at 500° C. As a result, an electromechanical transduction film with a thickness of 90 nm was obtained. In another example, a rectangular pattern with a width of 50 μm and a length of 500 μm was formed as shown by FIG. 10. The rectangular pattern includes application areas 41 to which the PZT precursor solution is to be applied and four non-application areas 42 where the PZT precursor solution is not to be applied. Each of the non-application areas 42 has a size of 50 μm×50 μm and they are disposed at regular intervals in the rectangular pattern. The non-application areas 42 were covered by a resist film in a photolithography step such that a hydrophobic SAM film was left even after an oxygen plasma exposure step. Next, as shown in FIG. 11, multiple rectangular patterns of FIG. 10 were arranged in the width direction (pitch 1/2). Then, the PZT precursor solution was applied to an application area 43 around the arranged patterns to form a square pattern of 700 μm×700 μm consisting of lines with a width of 50 μm. Prior to the application of the PZT precursor solution, the SAM film was removed from the application area 43 in the photolithography step and the oxygen plasma exposure step to make its surface hydrophilic.

Next, a first example of a repetitive film forming process is described. After cleaning a surface of a sample prepared in the above example with isopropyl alcohol, a SAM film was formed on the surface by micro contact printing. The contact angle of water on the PZT film (electromechanical transduction film) was 5 degrees or less (fully wet), and the contact angle of water on the SAM film was 92.0 degrees. These results confirmed that the self-assembled SAM film was properly formed as shown in FIG. 6B. The PZT precursor solution was applied by spin coating and a PZT film was formed only on the previously formed PZT film. Then, the PZT film was heat-treated. As a result of forming the PZT film twice, the thickness of the electromechanical transduction film increased to 180 nm.

Figure 12:
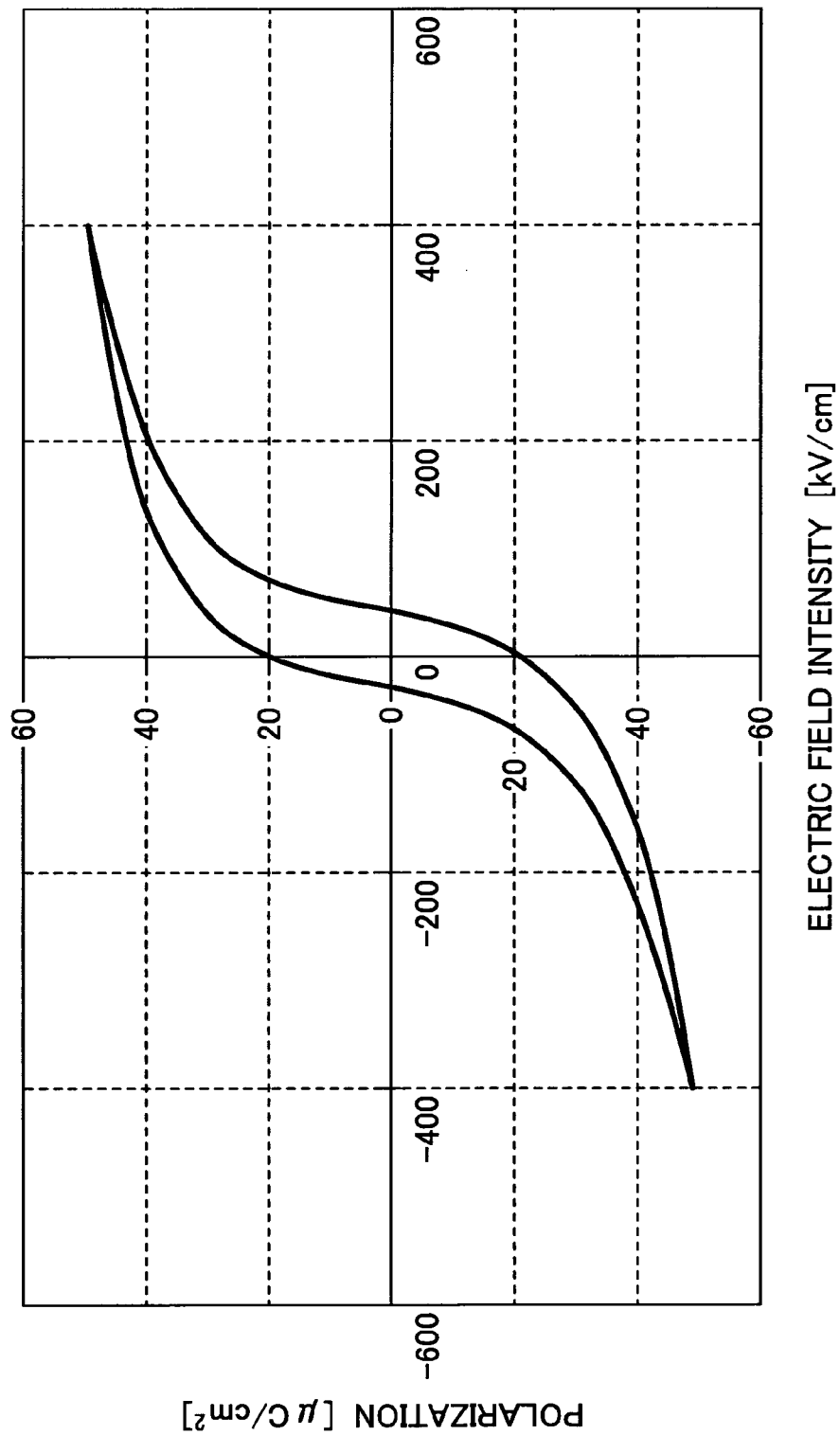
FIG. 12 is a graph showing a hysteresis curve of electric field intensity and polarization.

The process shown by FIGS. 6A through 6D was repeated five times (film-forming process was repeated six times in total) to obtain an electromechanical transduction film with a thickness of 540 nm, and heat treatment for crystallization (at 700° C.) was performed by rapid thermal annealing (RTA). No defect such as a crack was found in the electromechanical transduction film. Further, formation of the SAM film, selective application of the PZT precursor solution, solvent drying at 120° C., and thermal decomposition at 500° C. were repeated six times, and crystallization was performed. No defect such as a crack was found in the obtained electromechanical transduction film, and its thickness reached 1000 nm. An upper electrode (platinum) was formed on the electromechanical transduction film, and the electrical characteristics and the electromechanical transduction performance (piezoelectric constant) of the electromechanical transduction film was evaluated. The relative dielectric constant of the electromechanical transduction film was 1220, the dielectric loss was 0.02, the remanent polarization was 19.3 μC/cm$^2$, and the coercive electric field was 36.5 kV/cm. Thus, the electromechanical transduction film showed characteristics equivalent to those of a ceramic sintered body (see the P-E hysteresis curve shown in FIG. 12). The electromechanical transduction performance was calculated by a simulation based on the amount of deformation of the electromechanical transduction film measured by a laser Doppler vibrometer. The piezoelectric constant d31 was −120 pm/V and equivalent to that of a ceramic sintered body. Thus, the electromechanical transduction film showed characteristics that are sufficient for a liquid-droplet jetting head.

As another example, the thickness of the electromechanical transduction film was further increased without forming the upper electrode. A process of repeating the thermal decomposition and annealing 6 times and performing crystallization once was repeated 10 times. As a result, a patterned PZT film (electromechanical transduction film) with a thickness of 5 μm was obtained and no defect such as a crack was found.

As still another example, an electromechanical transduction film of (Pb0.95 Sr0.05) [(Mg$_{1/3}$ Nb$_{2/3}$)0.375 Zr0.265 Ti0.36]O$_3$ was formed. The same metallic elements as the above example were used as the starting materials. Also, as other elements, strontium propoxide, magnesium ethoxide, and niobium ethoxide were used. These materials were dissolved in methoxyethanol used as a common solvent to obtain a homogeneous precursor solution. The electromechanical transduction film formed by a sol-gel method using the precursor solution had a relative dielectric constant of 2300, a coercive electric field of 25 kV/cm, and a remanent polarization of 32.3 μC/cm$^2$. Thus, the electromechanical transduction film had characteristics equivalent to those of bulk ceramics. Also, an electromechanical transduction film of Pb[(Ni$_{1/3}$ Nb$_{2/3}$)0.5 Zr0.15 Ti0.35]O$_3$ was formed. As a starting material of nickel, nickel (II) acetylacetonato dehydrate was dehydrated and dissolved in methoxyethanol. Methoxyethanol was used as a common solvent for other alkoxide compounds and a homogeneous precursor solution was obtained. The electromechanical transduction film formed by a sol-gel method using this precursor solution had a relative dielectric constant of 4000, a coercive electric field of 20 kV/cm, and a remanent polarization of 27.5 µC/cm². Thus, the electromechanical transduction film had characteristics equivalent to those of bulk ceramics.

A lower electrode was formed by forming a film of ruthenium acid strontium with a thickness of 200 nm by reactive sputtering and forming a film of platinum with a thickness of 2 nm on the film of ruthenium acid strontium. Further, electrode films of ruthenium, iridium, and rhodium (other platinum group elements) were formed with the same thickness. The films were formed by sputtering and the same SAM molecules and processing methods as the above examples were used. Also, a film of a platinum-rhodium alloy (rhodium concentration: 15 wt %) was formed. Further, another sample was prepared by forming an iridium metal film or a platinum film on an iridium oxide film. A SAM film was formed on the formed films as in the above examples. In all cases, the contact angle of water on an area without the SAM film was 5 degrees or less (fully wet), and the contact angle of water on an area with the SAM film was 90.0 degrees.

Figure 13:
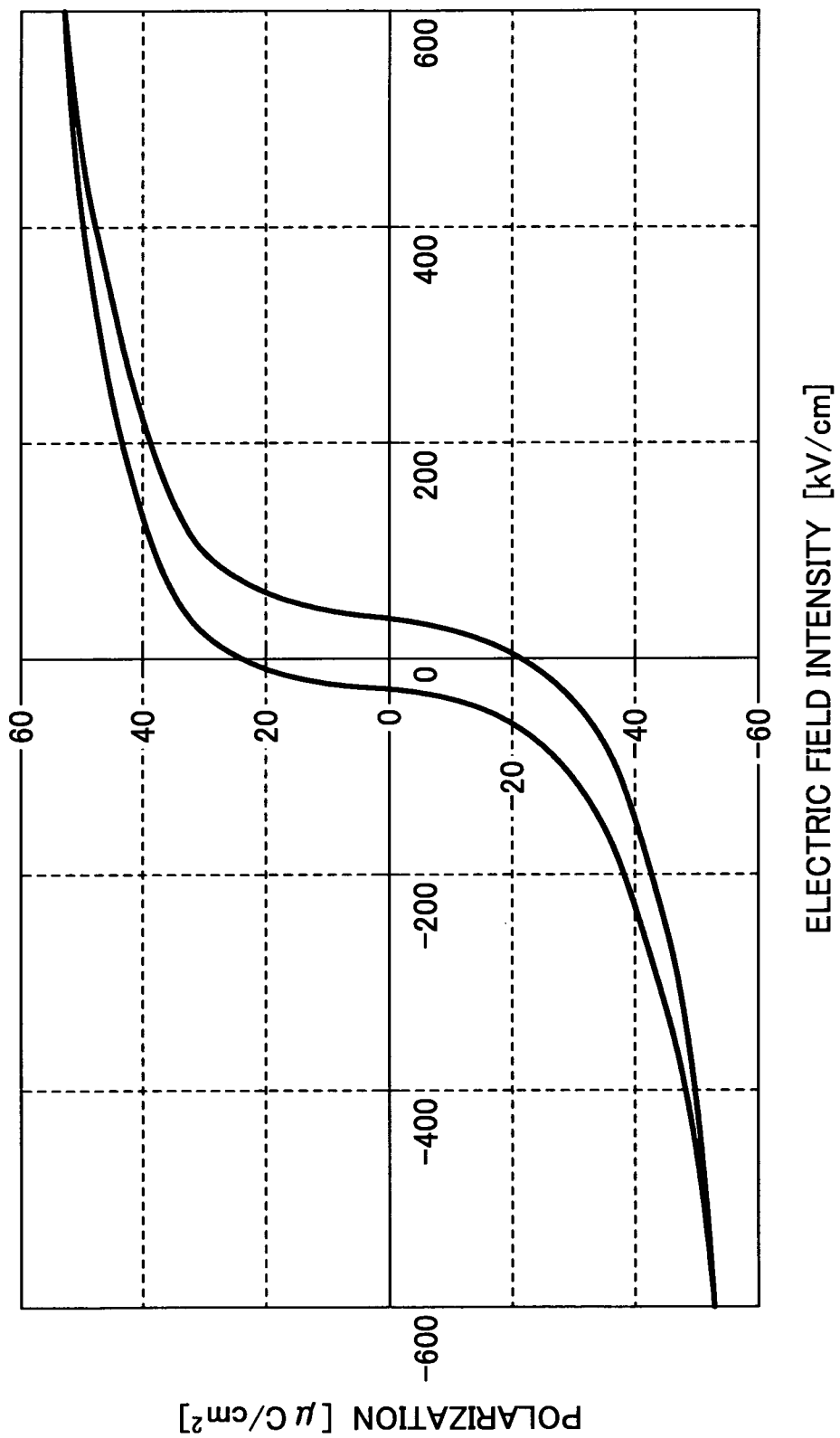
FIG. 13 is a graph showing another hysteresis curve of electric field intensity and polarization.

FIG. 13 shows a P-E hysteresis curve of a PZT (53/47) film using a lower electrode formed by depositing a Pt film (thickness: 2 nm) on an SRO electrode. The PZT film had a relative dielectric constant of 1300, a coercive electric field of 35 kV/cm, and a remanent polarization of 22.2 µC/cm². Thus, the PZT film had characteristics equivalent to those of a related-art electromechanical transduction film.

Next, a second example of a repetitive film forming process is described. The thickness of an electromechanical transduction film obtained by a single film forming process is preferably about 100 nm. To achieve this thickness, the precursor concentration is optimized based on a film forming area and the amount of precursor to be applied. As shown in FIG. 1E, a precursor solution applied by a liquid-droplet jetting apparatus spreads only in a hydrophilic area and forms a pattern because of the contrast in the contact angle. The formed pattern was heat-treated at 120° C. (solvent drying) and thermal decomposition of organic matter was performed. As a result, an electromechanical transduction film with a thickness of 90 nm was obtained as shown in FIG. 1F. After cleaning the electromechanical transduction film with isopropyl alcohol, a SAM film was formed by dip coating. In the second or subsequent cycle of the film forming process, the SAM film is not formable on the oxide film. Therefore, a patterned SAM film can be obtained as shown in FIG. 7B without performing a photolithography step. The contact angle of pure water on the SAM film was 92 degrees and the contact angle of pure water on the PZT film was 34 degrees. Then, the PZT precursor solution was applied again by a liquid-droplet jetting apparatus onto the PZT film formed in the first cycle of the film forming process as shown in FIG. 7C. Heat treatment was performed as in the first cycle of the film forming process. With two cycles of the film forming process, a PZT film with a thickness of 180 nm was obtained. In the fourth cycle of the film forming process, on the PZT films separately formed in a rectangular pattern, different portions of a PZT precursor solution 44 joined on hydrophobic surfaces in a pattern 45 due to surface tension (see FIG. 14A). Heat treatment was performed on the PZT precursor solution 44. Since the SAM film on the hydrophobic surfaces in the pattern 45 had been removed, the pattern 45 was transformed into a unitary PZT film 46 with an even thickness (see FIG. 14B). The thickness of the PZT film 46 was 360 nm. The film forming process was repeated two more times, i.e., repeated six times in total. Even though the PZT precursor solution was jetting from the same position, the PZT precursor solution spread uniformly on the previously formed PZT film. After a PZT film with a thickness of 540 nm was obtained, heat treatment for crystallization (at 700° C.) was performed by rapid thermal annealing (RTA). No defect such as a crack was found in the obtained electromechanical transduction film.

Figure 15A:
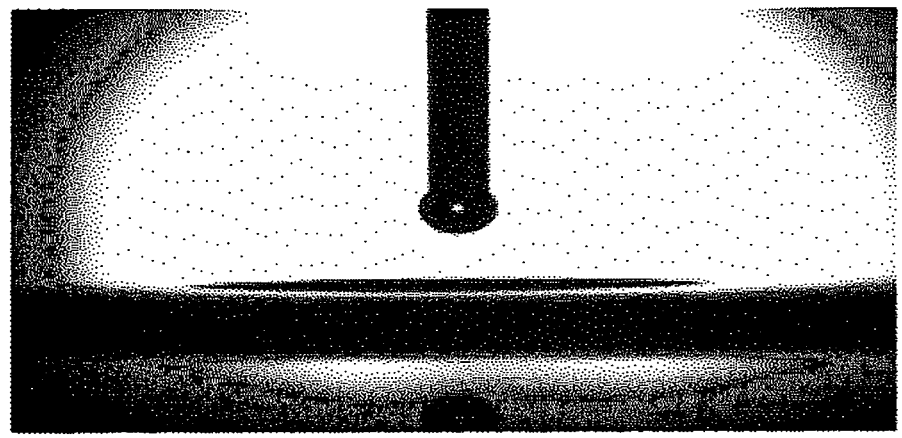
FIGS. 15A and 15B are drawings illustrating contact angles of water on an area where a SAM film is removed and an area where a SAM film is formed.
Figure 15B:
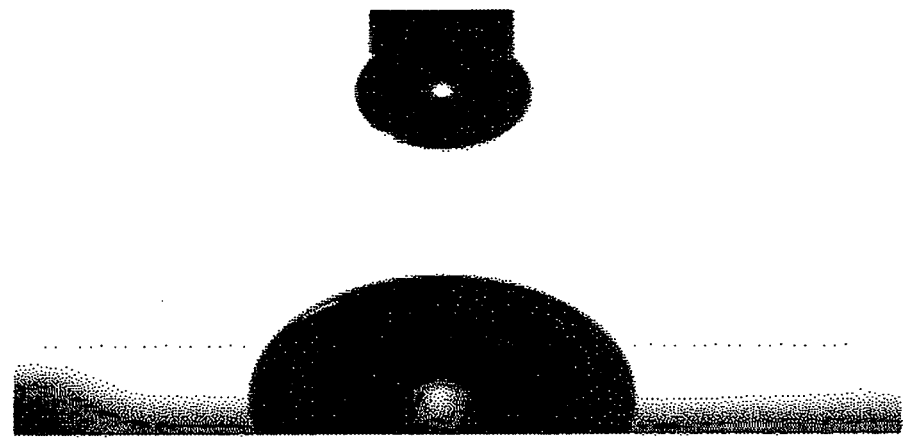

Next, a third example of a repetitive film forming process is described. Electrode films of other platinum group elements, ruthenium, iridium, and rhodium, were formed by sputtering on a silicon wafer coated with a thermally-oxidized film and a titanium adhesion layer. The same SAM molecules and processing method as in the first example were used. Also, a film of a platinum-rhodium alloy (rhodium concentration: 15 wt %) was formed. Further, another sample was prepared by forming an iridium metal film or a platinum film on an iridium oxide film. In all cases, the contact angle of water on an area without the SAM film was 5 degrees or less (fully wet) as shown by FIG. 15A, and the contact angle of water on an area with the SAM film was 92.2 degrees as shown by FIG. 15B.

FIGS. 16A and 16B are drawings illustrating exemplary dummy patterns of a PDMS stamp. In the micro contact printing method using the PDMS stamp 19 shown in FIGS. 4A through 4F, a 0.1-100 µm pattern is transferred onto a substrate. Therefore, with a pattern having a high aspect ratio (e.g., with a length of 100 µm or more and a width of 30-60 µm) as shown in FIG. 16A, the transfer efficiency is very low. To improve the transfer efficiency, it is preferable to decrease the aspect ratio by segmenting a pattern in the length direction such that each segment has a length that is an integral multiple of the width and is less than 100 µm. In the example shown in FIG. 16B, a dummy pattern 51 is segmented into square patterns.

Meanwhile, when forming a patterned electromechanical transduction film (or a collection of electromechanical transduction films arranged to form a pattern) by jetting and drying a PZT precursor solution, the difference in the drying rate of a solvent in the PZT precursor solution results in uneven thickness of the electromechanical transduction film. As an organic solvent of a PZT precursor solution (including a PZT precursor and the organic solvent) jetted onto a substrate dries, convection occurs and the solid content of the PZT precursor solution concentrates in areas where the organic solvent dries faster. This is called a "coffee stain effect". When forming a PZT precursor pattern (patterned electromechanical transduction film), it is desired to achieve even thickness in addition to accurately forming the pattern. In an experiment where a pattern including multiple electromechanical transduction films (areas where the electromechanical transduction film was formed) was formed, the coffee stain effect was observed in the electromechanical transduction films at both ends of the pattern. This is because the atmosphere in the center portion of the pattern is rich in the organic solvent due to the organic solvent evaporating from the electromechanical transduction films (or the PZT precursor solution) to the right and left of the center portion, but the atmosphere at the ends of the pattern is poor in the organic solvent and the electromechanical transduction films tend to dry faster. For the above reason, to form actuators of an inkjet head with a uniform thickness, it is preferable to form one or more dummy patterns (dummy electromechanical transduction films) that are not used for actual inkjetting to make the drying rate of the solvent uniform.

Figure 17:
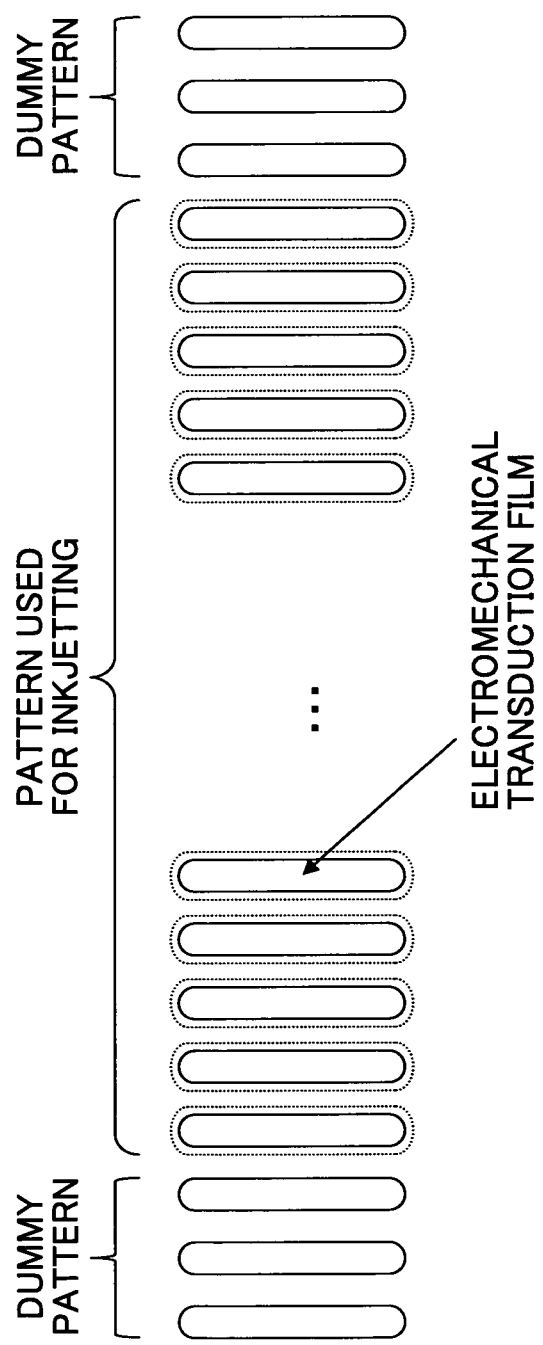
FIG. 17 is a drawing illustrating dummy patterns formed to obtain electromechanical transduction films with a uniform thickness.

In an example shown in FIG. 17, a pattern including oblong electromechanical transduction films arranged at intervals of 84.6 μm (300 dpi) was formed by inkjet printing together with dummy patterns each including three (dummy) electromechanical transduction films. The resulting electromechanical transduction films (other than the dummy patterns) had a uniform thickness.

Figure 18:
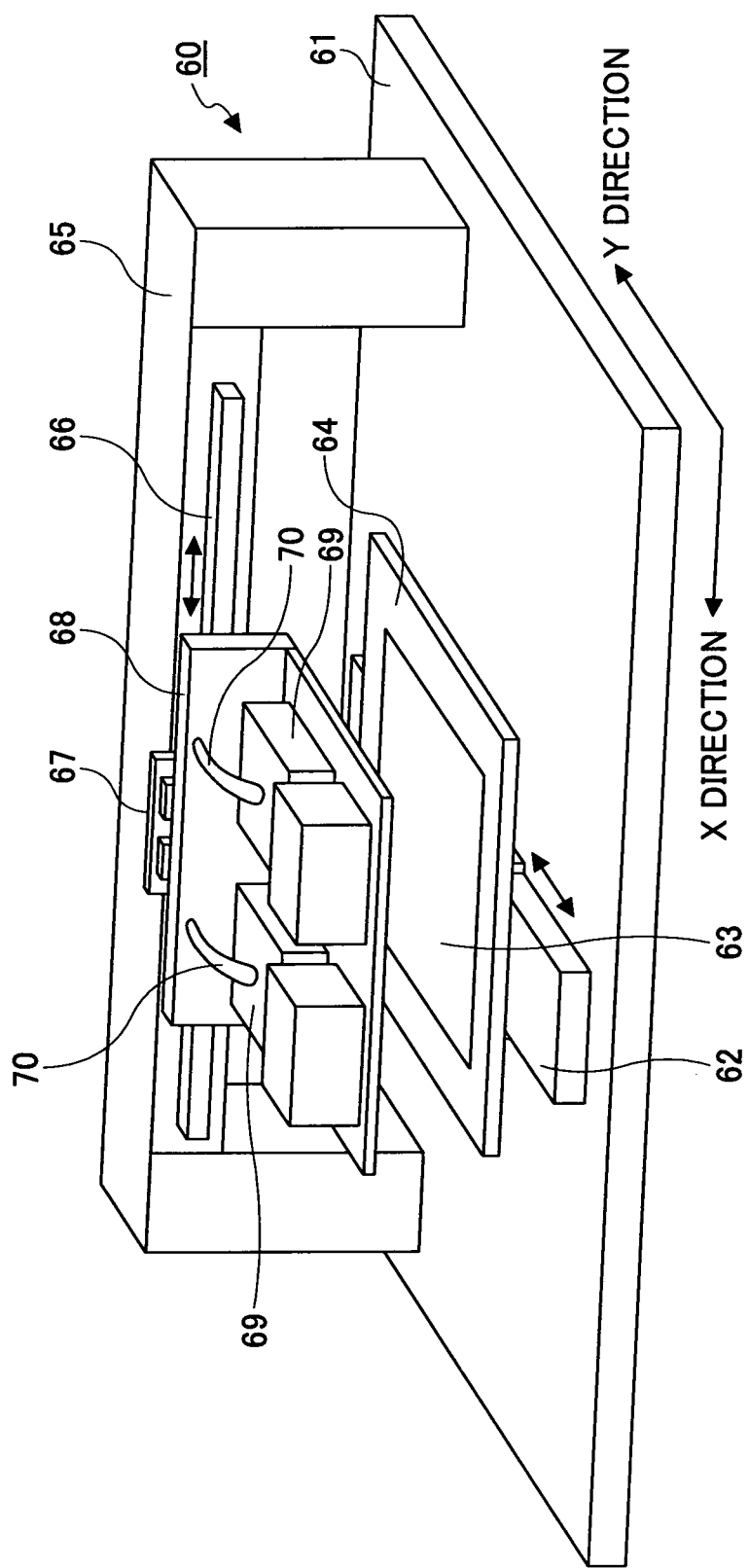
FIG. 18 is a drawing illustrating a configuration of a liquid-droplet jetting apparatus including a liquid-droplet jetting head.

FIG. 18 is a perspective view of a liquid-droplet jetting apparatus 60 including a liquid-droplet jetting head used in the processes described with reference to FIGS. 5A through 5F and 7A through 7D. The liquid-droplet jetting apparatus 60 includes a pedestal 61, a Y-axis drive unit 62 disposed on the pedestal 61, and a stage 64 disposed on the Y-axis drive unit 62. The stage 64 is movable in the Y-axis direction and is used to mount a substrate 63 on. An attracting unit (not shown) for attracting and fixing the substrate 63 by vacuum or static electricity is attached to the stage 64. The liquid-droplet jetting apparatus 60 also includes an X-axis support part 65, an X-axis drive unit 66 attached to the X-axis support part 65, a Z-axis drive unit 67, and a head base 68 mounted on the Z-axis drive unit 67. The Z-axis drive unit 67 is attached to the X-axis drive unit 66 such that the head base 68 is movable in the X-axis direction. Liquid-droplet jetting heads 69 for jetting liquid droplets are mounted on the head base 68. Liquids are supplied to the liquid-droplet jetting heads 69 via supply pipes 70 from liquid tanks (not shown).

FIGS. 19A and 19B are drawings illustrating a configuration of an inkjet recording apparatus 100 that is an example of a liquid-droplet jetting apparatus according to another embodiment of the present invention. FIG. 19A is a cut-away side view and FIG. 19B is a perspective view of the inkjet recording apparatus 100. The inkjet recording apparatus 100 includes liquid-droplet jetting heads including electromechanical transducers produced by any one of the production methods described in the above embodiments. As shown in FIGS. 19A and 19B, the inkjet recording apparatus 100 includes a printing mechanism 104. The printing mechanism 104 includes a carriage 101 movable in the main-scanning direction, recording heads 102 mounted on the carriage 101, and ink cartridges 103 for supplying ink to the corresponding recording heads 102. The recording heads 102 are inkjet heads that are examples of liquid-droplet jetting heads according to an embodiment of the present invention. A paper-feed cassette 106 is detachably attached to a lower front part of an apparatus body of the inkjet recording apparatus 100. The paper-feed cassette 106 can hold multiple sheets of paper 105. A manual-feed tray 107 for manually feeding the paper 105 is also provided on the apparatus body. The printing mechanism 104 records an image on the paper 105 fed from the paper-feed cassette 106 or the manual-feed tray 107, and the paper 105 with the recorded image is ejected onto a paper catch tray 108 on the rear side of the apparatus body. The carriage 101 of the printing mechanism 104 is supported by a primary guide rod 109 and a secondary guide rode 110 stretched between right and left side boards (not shown) such that the carriage 101 is slidable in the main-scanning direction. The recording heads 102, respectively, jet yellow (Y), cyan (C), magenta (M), and black (Bk) inks. The recording heads 102 are mounted on the carriage 101 such that their inkjet nozzles face downward and the arranging direction of the inkjet nozzles become orthogonal to the main-scanning direction. The ink cartridges 103 are replaceably mounted on the carriage 101 and contain the corresponding color inks to be supplied to the recording heads 102. Each of the ink cartridges 103 has an atmospheric opening in communication with the atmosphere on the upper side, has a supply opening for supplying ink to the corresponding recording head 102 on the lower side, and includes a porous body filled with ink to be supplied to the recording head 102. The capillary force of the porous body maintains the ink at a slightly negative pressure. In this embodiment, as described above, multiple recording heads 102 corresponding to the respective color inks are provided. Alternatively, one recording head having nozzles for jetting ink droplets of different colors may be used. The primary guide rod 109 is inserted into the rear side (downstream side in the paper conveying direction) of the carriage 101, and the front side (upstream side in the paper conveying direction) of the carriage 101 is placed on the secondary guide rode 110. Thus, the carriage 101 is slidably supported by the primary and secondary guide rods 109 and 110. A timing belt 114 is stretched between a drive pulley 112 rotated by a main-scanning motor 111 and a driven pulley 113, and is connected to the carriage 101. The carriage 101 is moved back and forth by the positive and negative rotations of the main-scanning motor 111.

A mechanism for conveying the paper 105 from the paper-feed cassette 106 to a position below the recording heads 102 include a paper-feed roller 115 and a friction pad 116 for separating and feeding sheets of the paper 105 from the paper-feed cassette 106; a guide part 117 for guiding the fed paper 105; a conveying roller 118 for reversing and conveying the paper 105; a conveying roller 119 for pressing the paper 105 onto the circumferential surface of the conveying roller 118; and a leading roller 120 for determining the angle of the paper 105 fed from the conveying roller 118. The conveying roller 118 is rotated by a sub-scanning motor 121 via a gear train. A print support part 122 is provided below the recording heads 102 to cover a moving range in the main-scanning direction of the carriage 101. The print support part 122 is a paper guide part for guiding the paper 105 fed from the conveying roller 118. A conveying roller 123 and a spur 124, which are rotated to feed the paper 105 in the paper ejecting direction, are provided downstream of the print support part 122 in the paper conveying direction. Also, guide parts 127 and 128 forming a paper-ejecting path and a paper-eject roller 125 and a spur 126 for ejecting the paper 105 onto the paper catch tray 108 are provided downstream of the conveying roller 123 and the spur 124 in the paper conveying direction. The recording heads 102 are driven and the carriage 101 is moved according to an image signal to jet ink droplets onto the paper 105 that is not being moved and thereby to record a line of image. Then, the paper 105 is conveyed a specified distance, and the next line is recorded. When a recording end signal or a signal indicating that the rear edge of the paper 105 has reached the recording area is received, the recording process is terminated and the paper 105 is ejected. A maintenance/cleaning unit 129 for maintaining and cleaning clogged nozzles of the recording heads 102 is provided in a position out of the right end of a moving range of the carriage 101. The maintenance/cleaning unit 129 includes capping units and cleaning units. While the inkjet recording apparatus 100 is idle, the carriage 101 is moved into a position above the maintenance/cleaning unit 129. In this position, the recording heads 102 are covered by the capping units to retain moisture of the nozzles and thereby to prevent nozzle clogging caused by dried ink. Also, before or during a recording process, ink is jetted into a waste-ink receiver of the maintenance/cleaning unit 129 to maintain the viscosity of ink in the nozzles and thereby to maintain the ink jetting performance.

An aspect of the present invention provides a production method of an electromechanical transducer that makes it possible to form a patterned electromechanical transduction film with a simple process, the electromechanical transducer produced by the production method, a liquid-droplet jetting head including the electromechanical transducer, and a liquid-droplet jetting apparatus including the liquid-droplet jetting head.

An aspect of the present invention provides a method of producing an electromechanical transducer. The method includes a first step of partially modifying a surface of a first electrode; a second step of applying a sol-gel liquid including a metal composite oxide to a predetermined area of the partially-modified surface of the first electrode; a third step of performing drying, thermal decomposition, and crystallization on the applied sol-gel liquid to form an electromechanical transduction film; a fourth step of repeating the first, second, and third steps to obtain the electromechanical transduction film with a desired thickness; and a fifth step of forming a second electrode on the electromechanical transduction film. This method makes it possible to selectively form an electromechanical transduction film by a sol-gel method with fewer steps and also makes it possible to simplify a production process of an electromechanical transducer.

Each of the first electrode and the second electrode preferably includes a platinum group element or an oxide of a platinum group element, or is preferably made of a laminated film of two or more of platinum group elements and oxides of platinum group elements.

The first step may be performed by forming a film of a thiol compound on the surface of the first electrode and by partially removing the film of the thiol compound by photolithography and etching or by ultraviolet irradiation through a mask. This method makes it possible to efficiently modify a part of the surface of the first electrode and thereby to selectively apply the sol-gel liquid by using the difference in wettability.

The first step may be performed by forming a film of a thiol compound on a part of the surface of the first electrode using a stamp for micro contact printing. This method makes it possible to efficiently modify a part of the surface of the first electrode and thereby to selectively apply the sol-gel liquid by using the difference in wettability.

The sol-gel liquid preferably includes a metal composite oxide represented by a chemical formula $ABO_3$, where A indicates one or more of Pb, Ba, and Sr and B indicates one or more of Ti, Zr, Sn, Ni, Zn, Mg, and Nb.

The first electrode preferably includes a metal composite oxide represented by a chemical formula $ABO_3$, where A indicates one or more of Sr, Ba, Ca, and La and B indicates one or more of Ru, Co, and Ni.

In the second step, the sol-gel liquid may be applied to the predetermined area of the partially-modified surface of the first electrode by a liquid-droplet jetting head. This method makes it possible to selectively form an electromechanical transduction film by a sol-gel method.

In the first step, an area of the surface of the first electrode other than the predetermined area to which the sol-gel liquid is applied may be modified into a hydrophobic surface.

A dummy pattern not related to an operation of the electromechanical transduction film may be formed outside of the electromechanical transduction film. This makes it possible to reduce the aspect ratio and thereby to improve the transfer efficiency.

The dummy pattern may be formed using a stamp for micro contact printing. This method makes it possible to easily form a dummy pattern and to easily modify a non-application area, to which the sol-gel liquid is not to be applied, into a hydrophobic surface.

The present invention is not limited to the specifically disclosed embodiments, and variations and modifications may be made without departing from the scope of the present invention.

The present application is based on Japanese Priority Application No. 2009-128383 filed on May 28, 2009, and Japanese Priority Application No. 2010-119873 filed on May 25, 2010, the entire contents of which are hereby incorporated herein by reference.

The invention claimed is:

1. A method of producing an electromechanical transducer, the method comprising:
   a first step of partially modifying a surface of a first electrode;
   a second step of applying a sol-gel liquid including a metal composite oxide to a predetermined area of the partially-modified surface of the first electrode;
   a third step of performing drying, thermal decomposition, and crystallization to the applied sol-gel liquid to form an electromechanical transduction film, wherein the drying includes a heat-treatment at 120° C., the decomposition includes thermal decomposition performed at 500° C., and the crystallization includes heat treatment for crystallization at 700° C.;
   a fourth step of repeating the first, second, and third steps to thicken the electromechanical transduction film to a desired thickness; and
   a fifth step of forming a second electrode on the electromechanical transduction film.

2. The method as claimed in claim 1, wherein each of the first electrode and the second electrode includes a platinum group element or an oxide of a platinum group element, or is made of a laminated film of two or more of platinum group elements and oxides of platinum group elements.

3. The method as claimed in claim 1, wherein in the first step, a film of a thiol compound is formed on the surface of the first electrode and the film of the thiol compound is partially removed by photolithography and etching or by ultraviolet irradiation through a mask.

4. The method as claimed in claim 1, wherein in the first step, a film of a thiol compound is formed on a part of the surface of the first electrode using a stamp for micro contact printing.

5. The method as claimed in claim 1, wherein the sol-gel liquid includes the metal composite oxide represented by a chemical formula $ABO_3$, where A indicates one or more of Pb, Ba, and Sr and B indicates one or more of Ti, Zr, Sn, Ni, Zn, Mg, and Nb.

6. The method as claimed in claim 1, wherein the first electrode includes a metal composite oxide represented by a chemical formula $ABO_3$, where A indicates one or more of Sr, Ba, Ca, and La and B indicates one or more of Ru, Co, and Ni.

7. The method as claimed in claim 1, wherein in the second step, the sol-gel liquid is applied to the predetermined area of the partially-modified surface of the first electrode by a liquid-droplet jetting head.

8. The method as claimed in claim 1, wherein in the first step, an area of the surface of the first electrode other than the predetermined area to which the sol-gel liquid is applied is modified into a hydrophobic surface.

9. The method as claimed in claim 1, wherein a dummy pattern not used for electromechanical transduction is formed outside of the electromechanical transduction film.

10. The method as claimed in claim 9, wherein the dummy pattern is formed using a stamp for micro contact printing.

* * * * *